United States Patent
Yoshida

(10) Patent No.: US 10,971,527 B2
(45) Date of Patent: Apr. 6, 2021

(54) THIN-FILM TRANSISTOR SUBSTRATE INCLUDING DATA LINE WITH LOWER LAYER DATA LINE AND UPPER LAYER DATA LINE, AND LIQUID CRYSTAL DISPLAY DEVICE AND ORGANIC ELECTROLUMINESCENT DISPLAY DEVICE INCLUDING SAME

(71) Applicant: Sharp Kabushiki Kaisha, Sakai (JP)

(72) Inventor: Masahiro Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 51 days.

(21) Appl. No.: 16/565,593

(22) Filed: Sep. 10, 2019

(65) Prior Publication Data

US 2020/0083256 A1    Mar. 12, 2020

Related U.S. Application Data

(60) Provisional application No. 62/729,467, filed on Sep. 11, 2018.

(51) Int. Cl.
*H01L 27/12* (2006.01)
*H01L 29/786* (2006.01)
(Continued)

(52) U.S. Cl.
CPC .......... *H01L 27/124* (2013.01); *G02F 1/1368* (2013.01); *G02F 1/136286* (2013.01);
(Continued)

(58) Field of Classification Search
CPC ............... H01L 27/124; H01L 27/1225; H01L 29/78633; H01L 29/78648; H01L 29/7869; H01L 27/3262; H01L 27/3272; H01L 27/3276; H01L 27/1251; H01L 27/3244; G02F 1/1368; G02F 1/136286; G02F 2202/10; G02F 2001/13685;
(Continued)

(56) References Cited

U.S. PATENT DOCUMENTS

| 9,673,267 | B2* | 6/2017 | Kim | .................... H01L 27/3265 |
| 2008/0012008 | A1* | 1/2008 | Song | .................... H01L 51/0021 |
| | | | | 257/40 |
| 2008/0068533 | A1* | 3/2008 | Yun | .................... G02F 1/133514 |
| | | | | 349/68 |
| 2012/0126233 | A1* | 5/2012 | Chang | .................... H01L 27/124 |
| | | | | 257/59 |

(Continued)

FOREIGN PATENT DOCUMENTS

JP    2013-251526 A    12/2013

*Primary Examiner* — Mohammad M Hoque
(74) *Attorney, Agent, or Firm* — Keating & Bennett, LLP

(57) ABSTRACT

The thin-film transistor substrate of the present invention includes a gate line; a data line; one or more thin-film transistors; and a stack disposed on the insulating substrate and sequentially including a first line layer, a second line layer, and a third line layer, at least one of the thin-film transistors being connected to the gate line and the data line, at least one of the thin-film transistors including a lower layer gate electrode disposed in the first line layer, and an upper layer gate electrode disposed in the second line layer, the gate line being disposed in the first line layer, the data line including a lower layer data line disposed in the second line layer and an upper layer data line disposed in the third line layer, the gate line intersecting at least one of the lower layer data line or the upper layer data line.

7 Claims, 17 Drawing Sheets

(51) Int. Cl.
*G02F 1/1368* (2006.01)
*G02F 1/1362* (2006.01)
*H01L 27/32* (2006.01)
*G02F 1/136* (2006.01)

(52) U.S. Cl.
CPC ...... *H01L 27/1225* (2013.01); *H01L 29/7869* (2013.01); *H01L 29/78633* (2013.01); *H01L 29/78648* (2013.01); *G02F 1/13606* (2021.01); *G02F 1/13685* (2021.01); *G02F 1/136209* (2013.01); *G02F 2202/10* (2013.01); *H01L 27/3262* (2013.01); *H01L 27/3272* (2013.01); *H01L 27/3276* (2013.01)

(58) Field of Classification Search
CPC ..... G02F 2001/13606; G02F 1/136209; G02F 2001/13629; G02F 1/133707
USPC .......................................................... 257/43
See application file for complete search history.

(56) References Cited

U.S. PATENT DOCUMENTS

| | | |
|---|---|---|
| 2013/0320328 A1 | 12/2013 | Lee et al. |
| 2015/0144939 A1* | 5/2015 | Choi .................... H01L 27/1259 257/43 |
| 2015/0144952 A1* | 5/2015 | Kim .................. H01L 29/78696 257/72 |
| 2015/0155505 A1* | 6/2015 | Yamazaki ........... H01L 27/3272 257/40 |
| 2015/0333154 A1 | 11/2015 | Lee et al. |
| 2015/0333184 A1 | 11/2015 | Lee et al. |
| 2017/0186778 A1* | 6/2017 | Miyake ............. H01L 29/78606 |
| 2017/0278874 A1* | 9/2017 | Yamazaki ........... H01L 29/7782 |
| 2018/0083085 A1* | 3/2018 | Moon ................ H01L 27/3276 |
| 2019/0006390 A1* | 1/2019 | Park .................... H01L 27/1251 |
| 2020/0111413 A1* | 4/2020 | Park ..................... G09G 3/3677 |
| 2020/0176699 A1* | 6/2020 | Lee ..................... H01L 27/3248 |

* cited by examiner

THIN-FILM TRANSISTOR SUBSTRATE INCLUDING DATA LINE WITH LOWER LAYER DATA LINE AND UPPER LAYER DATA LINE, AND LIQUID CRYSTAL DISPLAY DEVICE AND ORGANIC ELECTROLUMINESCENT DISPLAY DEVICE INCLUDING SAME

CROSS-REFERENCE TO RELATED APPLICATIONS

The present application claims priority under 35 U.S.C. § 119 to U.S. Provisional Patent Application No. 62/729,467 filed on Sep. 11, 2018, the contents of which are incorporated herein by reference in their entirety.

BACKGROUND OF THE INVENTION

Field of the Invention

The present invention relates to thin-film transistor substrates, liquid crystal display devices, and organic electroluminescent display devices. More specifically, the present invention relates to a thin-film transistor substrate with thin-film transistors each including a lower layer gate electrode and an upper layer gate electrode, and a liquid crystal display device and an organic electroluminescent display device each including the thin-film transistor substrate.

Description of Related Art

Thin display devices such as liquid crystal display devices and organic electroluminescent (hereinafter, also abbreviated to EL) display devices typically include a thin-film transistor substrate including many thin-film transistors (hereinafter, also abbreviated to TFTs). Known TFTs include single gate TFTs each including one gate electrode and double gate TFTs each including two gate electrodes, one in an upper layer relative to a semiconductor layer and the other in a lower layer relative to the semiconductor layer. A conventional semiconductor layer of a TFT is made of a silicon material such as amorphous silicon or polycrystalline silicon, while a recent semiconductor layer is sometimes made of an oxide semiconductor.

Oxide semiconductors have advantages such as high electrical mobility and a comparatively simple film formation process. Yet, an oxide semiconductor layer in a top gate TFT, a kind of single gate TFT, may lower the performance of the TFT as it is irradiated with light from the backlight of the liquid crystal display device.

JP 2013-251526 A discloses a top gate TFT including an oxide semiconductor layer and a light-shielding film in a lower layer relative to the oxide semiconductor layer. JP 2013-251526 A also discloses a double gate TFT including an oxide semiconductor layer.

BRIEF SUMMARY OF THE INVENTION

Display defects (flicker or streaky luminance unevenness) in the gate line direction tend to occur when a display device including top gate TFTs with an oxide semiconductor layer and utilizing the channel light-shielding film as lower layer gate electrodes, i.e., a display device including double gate TFTs each including two gate electrodes, one in an upper layer relative to a semiconductor layer and the other in a lower layer relative to the semiconductor layer, is designed to have a redundant structure with double data lines obtained by adding data lines in another layer.

The reason for the display defects is described with reference to FIG. 15 to FIG. 17. FIG. 15 is a schematic plan view of a liquid crystal display device of Comparative Embodiment 1. As shown in FIG. 15, a liquid crystal display device 100R of Comparative Embodiment 1 includes a thin-film transistor substrate (hereinafter, TFT substrate) 100AR, a counter substrate 100BR facing the TFT substrate 100AR, and a liquid crystal layer (not shown) between the TFT substrate 100AR and the counter substrate 100BR.

The TFT substrate 100AR includes data lines 101R, gate lines 102R intersecting the data lines 101R, and thin-film transistors (hereinafter, TFTs) 103R serving as switching elements. Each data line 101R consists of a lower layer data line 1011R and an upper layer data line 1012R. In each region surrounded by two adjacent data lines 101R and two adjacent gate lines 102R is disposed a pixel electrode 118R. Each pixel electrode 118R is connected to the corresponding data line 101R via the semiconductor layer of the corresponding TFT 103R. A common electrode 120R provided with slits (openings) 120SR is formed above the pixel electrodes 118R to cover substantially the entire display region except for the slits 120SR. The counter substrate 100BR includes a color filter layer (not shown) and a black matrix layer 121R.

FIG. 16 is an enlarged schematic plan view of the region surrounded by the dashed line in FIG. 15. FIG. 17 is a schematic cross-sectional view of a TFT substrate in the liquid crystal display device of Comparative Embodiment 1. FIG. 17 shows the cross section taken along the line E1-E2 in FIG. 16.

As shown in FIG. 16 and FIG. 17, the TFT substrate 100AR includes, on an insulating substrate 110R, a stack sequentially including a first line layer 111R, a lower layer insulating film 112R as a first insulating film, a semiconductor layer 113R, a gate insulating film 114R as a second insulating film, a second line layer 115R, a first protective film 116R (a stack of an inorganic insulating film 116AR and a photosensitive organic film 116BR) as a third insulating film, a third line layer 117R, the pixel electrodes 118R, a second protective film 119R as a fourth insulating film, and the common electrode 120R. The first line layer 111R includes the lower layer data lines 1011R and lower layer gate electrodes 103G1R. The second line layer 115R includes the gate lines 102R and upper layer gate electrodes 103G2R. The third line layer 117R includes the upper layer data lines 1012R. Each TFT 103R in Comparative Embodiment 1 is a double gate TFT including the semiconductor layer 113R between its lower layer gate electrode 103G1R and its upper layer gate electrode 103G2R. The lower layer gate electrode 103G1R and the upper layer gate electrode 103G2R are connected to each other in the corresponding contact hole 100CH1R in the lower layer insulating film 112R and the gate insulating film 114R. Each upper layer data line 1012R is connected to the semiconductor layer 113R in the corresponding contact hole 100CH2R in the lower layer insulating film 112R and the gate insulating film 114R, and connected to the corresponding lower layer data line 1011R in the corresponding contact hole 100CH3R in the first protective film 116R, the lower layer insulating film 112R, and the gate insulating film 114R.

In the liquid crystal display device 100R of Comparative Embodiment 1, the lower layer data lines 1011R are disposed in the first line layer 111R formed under the gate insulating film 114R and the lower layer insulating film 112R in lower layers of the gate lines 102R, the upper layer data lines 1012R are disposed in the third line layer 117R on the first protective film 116R in an upper layer relative to the gate lines 102R, and redundant lines for the data lines 101R are formed by the respective lower layer data lines 1011R and upper layer data lines 1012R. Thus, in the liquid crystal display device 100R, the lower layer data lines 1011R are disposed in a lower layer relative to the gate lines 102R and the upper layer data lines 1012R are disposed in an upper layer relative to the gate lines 102R, so that the capacitance at the intersections of the gate lines 102R with the lower layer data lines 1011R and the upper layer data lines 1012R and thereby gate signal dullness increases.

JP 2013-251526 A discloses in FIGS. 9 and 10 a top gate TFT (especially a self-alignment double gate structure) including an oxide semiconductor layer and a channel light-shielding film, wherein the gate line is formed in the same layer as the lower layer gate electrode. JP 2013-251526 A, however, does not mention any mode in which the data lines have a redundant structure.

JP 2013-251526 A also discloses in FIG. 20 a structure in which the data lines are formed in the same layer as the channel light-shielding film and the gate lines are formed in the same layer as the upper layer gate electrodes. If, based on this structure, redundant lines for the data lines are formed in the line layer (third line layer) on an insulating film in an upper layer relative to the gate lines, data lines are to be disposed both in an upper layer and a lower layer relative to the gate lines. This increases the capacitance at the intersections of the gate lines and the data lines as in Comparative Embodiment 1, increasing the gate signal dullness. Also, J P 2013-251526 A discloses in FIG. 20 a structure in which the source electrodes of the TFTs are formed in the line layer in an upper layer relative to the gate lines, but does not mention the redundant structure for the data lines.

The present invention was made in view of the current state of the art, and an object of the present invention is to provide a thin-film transistor substrate which includes thin-film transistors each including an upper layer gate electrode and a lower layer gate electrode and data lines having a redundant structure and with which the parasitic capacitance between a data line and a gate line can be reduced; a liquid crystal display device; and an organic electroluminescent display device.

(1) An aspect of the present invention is directed to a thin-film transistor substrate including: a gate line; a data line; one or more thin-film transistors; an insulating substrate; and a stack disposed on the insulating substrate and sequentially including a first line layer, a first insulating film, a semiconductor layer, a second insulating film, a second line layer, a third insulating film, and a third line layer, at least one of the thin-film transistors being connected to the gate line and the data line, at least one of the thin-film transistors including a lower layer gate electrode disposed in the first line layer, the semiconductor layer, and an upper layer gate electrode disposed in the second line layer, the gate line being disposed in the first line layer, the data line including a lower layer data line disposed in the second line layer and an upper layer data line disposed in the third line layer, the gate line intersecting at least one of the lower layer data line or the upper layer data line.

(2) In an embodiment of the present invention, the thin-film transistor substrate includes the structure (1), and the lower layer data line and the upper layer data line are connected to each other.

(3) In an embodiment of the present invention, the thin-film transistor substrate includes the structure (1), the upper layer data line is not connected to the lower layer data line, and the upper layer data line overlaps the lower layer data line.

(4) In an embodiment of the present invention, the thin-film transistor substrate includes the structure (3), and the third insulating film includes no organic insulating film at least in part of the region where the lower layer data line and the upper layer data line overlap each other.

(5) In an embodiment of the present invention, the thin-film transistor substrate includes the structure (1), (2), (3), or (4), the upper layer gate electrode is disposed on the semiconductor layer with the second insulating film in between, and the second insulating film is not disposed on the semiconductor layer except for the region in which the upper layer gate electrode is disposed.

(6) Another aspect of the present invention is directed to a liquid crystal display device including the thin-film transistor substrate including any one of the structures (1), (2), (3), (4), or (5).

(7) Yet another aspect of the present invention is directed to an organic electroluminescent display device including the thin-film transistor substrate including any one of the structures (1), (2), (3), (4), or (5).

The present invention can provide a thin-film transistor substrate which includes thin-film transistors each including an upper layer gate electrode and a lower layer gate electrode and data lines having a redundant structure and with which the parasitic capacitance between a data line and a gate line can be reduced; a liquid crystal display device; and an organic electroluminescent display device.

DETAILED DESCRIPTION OF THE INVENTION

Figure 1:
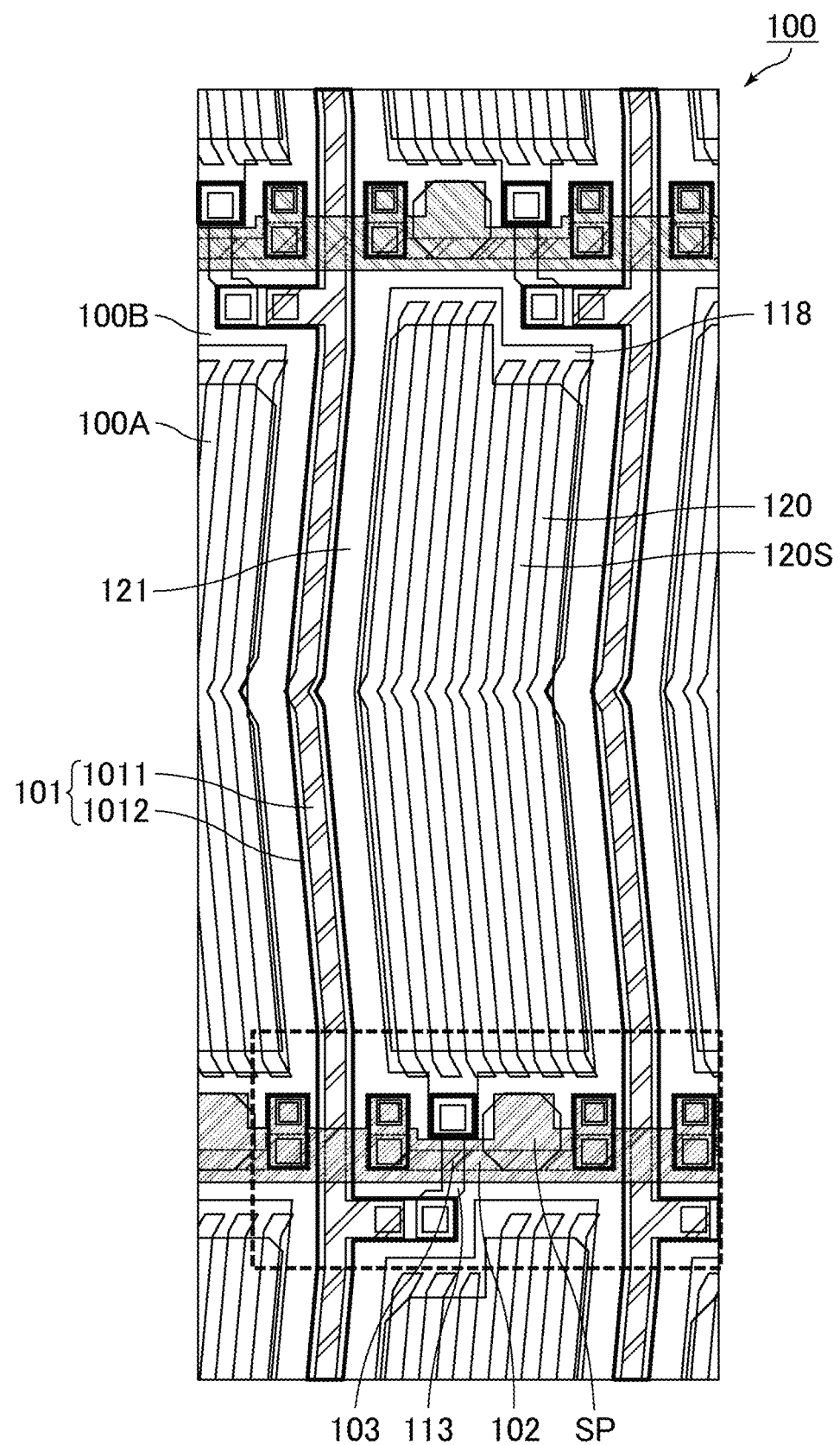
FIG. 1 is a schematic plan view of a liquid crystal display device of Embodiment 1, with a first line layer and a second line layer highlighted.

Hereinafter, thin-film transistor substrates, liquid crystal display devices, and organic electroluminescent display devices of embodiments of the present invention are described. The embodiments are not intended to limit the scope of the present invention. The design may be modified as appropriate within the range satisfying the configuration of the present invention. The configurations in the embodiments may appropriately be combined or modified within the spirit of the present invention.

The thin-film transistor substrates (hereinafter, TFT substrates) of the embodiments of the present invention each include a gate line, a data line, and one or more thin-film transistors. The TFT substrate further includes an insulating substrate and a stack disposed on the insulating substrate and sequentially including a first line layer, a first insulating film, a semiconductor layer, a second insulating film, a second line layer, a third insulating film, and a third line layer. At least one of the TFTs is connected to the gate line and the data line. At least one of the TFTs includes a lower layer gate electrode disposed in the first line layer, the semiconductor layer, and an upper layer gate electrode disposed in the second line layer. The gate line is disposed in the first line layer. The data line includes a lower layer data line disposed in the second line layer and an upper layer data line disposed in the third line layer. The gate line intersects at least one of the lower layer data line or the upper layer data line.

In the TFT substrate, the gate line is disposed in the first line layer, and the lower layer data line and the upper layer data line are disposed respectively in the second line layer and the third line layer which are upper layers of the first line layer. Thus, the data line can have a redundant structure in an upper layer relative to the gate line without the gate line disposed between the lower layer data line and the upper layer data line, so that parasitic capacitance between the data line and the gate line can be reduced or eliminated.

The at least one of the TFTs connected to the gate line and the data line may be the same as or different from the at least one of the TFTs including the lower layer gate electrode and the upper layer gate electrode. In the case where the at least one of the TFTs connected to the gate line and the data line is the same as the at least one of the TFTs including the lower layer gate electrode and the upper layer gate electrode, the gate line is connected to the lower layer gate electrode.

The upper layer gate electrode and the lower layer gate electrode are each a gate electrode. The "gate electrode" is one of the three electrodes constituting a TFT (the other electrodes are a source electrode and a drain electrode), and modulates the charge amount to be induced in the corresponding channel region of the semiconductor layer according to the voltage applied to the gate electrode (e.g., the scanning signal supplied from a gate line), thereby controlling the current flowing between the source and drain electrodes. The first line layer in which the lower layer gate electrode is disposed is positioned on the lower side of the semiconductor layer, and the second line layer in which the upper layer gate electrode is disposed is positioned on the upper side of the semiconductor layer.

The "semiconductor layer" includes layers having the characteristics of semiconductors (e.g., channel regions) and layers (e.g., source regions and drain regions) having been subjected to a resistance reduction treatment (hereinafter, also referred to as conduction imparting treatment) causing a layer having the characteristics of semiconductors to have a lower resistivity than the channel regions.

The "gate line" is a line connected to gate electrodes (typically, a bus line connected to gate electrodes) of TFTs and supplies a scanning signal (signal that controls the on and off states of a TFT) to the gate electrodes of the TFTs connected. The "data line" is a line connected to source electrodes (typically, a bus line connected to source electrodes) of TFTs and supplies a data signal (e.g., video signal) to the TFTs connected. The "data line" may include a conductive line that can be connected to the source electrodes of TFTs by connection such as melt connection using a laser. One or both of the lower layer data line and the upper layer data line should be a conductive line connected to the source electrodes of TFTs. One of the lower layer data line and the upper layer data line may be a conductive line that can be connected to the source electrodes of TFTs by connection such as melt connection using a laser.

Typically, one of the gate line and the data line is disposed linearly to vertically cross the array region in which the TFTs are arranged in a matrix, and the other is disposed linearly to horizontally cross the array region. At least one of the lower layer data line or the upper layer data line is typically disposed linearly to horizontally or vertically cross the array region.

In order to connect the lower layer data line and the upper layer data line to each other without fail, the lower layer data line typically overlaps the upper layer data line.

Each of the line layers and the insulating films may be a single layer formed from a signal material, or may be a stack of layers of which adjacent two layers are formed from different materials.

Each line layer may be formed from any material, but is preferably formed from a metal. Each line layer is preferably a metal layer.

The upper layer data line preferably extends parallel to the lower layer data line and overlaps the lower layer data line. This structure can reduce the capacitance between the gate line and the data line while reducing or eliminating a decrease in transmittance in a liquid crystal display device including the TFT substrate. The structure can also achieve the effect (shadowing reduction effect) of reducing the capacitance between the electrode(s) (e.g., common electrode or pixel electrodes) disposed on the side remote from the insulating substrate of the data line and the data line. Also, in an organic electroluminescent display device (hereinafter, also referred to as an organic EL display device or an organic light emitting diode (OLED) display) including the TFT substrate, for example, the capacitance between the gate electrode of a TFT that controls the amount of current to be supplied to an OLED device layer and the upper layer data line can be reduced, so that changes in luminance during light emission can be reduced or eliminated.

The lower layer data line and the upper layer data line are preferably connected to each other. This mode (hereinafter, also referred to as the connection mode) can enhance the redundancy of the data line.

In the above connection mode, both of the lower layer data line and the upper layer data line are preferably disposed linearly to horizontally or vertically cross the array region, and the lower layer data line and the upper layer data line are preferably connected to each other near the corresponding TFTs in first openings from which at least the third insulating film is removed.

Also in the above connection mode, a second opening from which at least the third insulating film is removed is formed on a source region of the semiconductor layer, and the upper layer data line may be connected to the source region of the semiconductor layer in the second opening.

Meanwhile, preferably, the upper layer data line is not connected to the lower layer data line and overlaps the lower layer data line. This mode (hereinafter, also referred to as non-connection mode) enables closing of an open circuit of a data line when the open circuit occurs in one of the upper layer data line and the lower layer data line, by irradiating both sides of the open-circuited site with a laser beam from the insulating substrate side in the portion where the upper layer data line and the lower layer data line overlap each other and thereby connecting the upper layer data line and the lower layer data line. In other words, a transmission path for data signals can be set using one of the data lines while bypassing the open-circuited site of the other data line.

In the non-connection mode, the third insulating film is preferably a thin film, and preferably includes, for example, no organic insulating film at least in part of a region in which the lower layer data line and the upper layer data line overlap each other. In this case, the third insulating film may include no organic insulating film in the entire region in which the lower layer data line and the upper layer data line overlap each other, or may include no organic insulating film at all. In the non-connection mode, the third insulating film typically includes an inorganic insulating film.

In the non-connection mode, the lower layer data line is connected to the TFT in advance, and the upper layer data line is preferably not connected to the TFT when it is not melt-connected to the lower layer data line. This structure can reduce parasitic capacitance between the data line and other conductive lines or electrodes even when such conductive lines or electrodes are disposed in an upper layer relative to the lower layer data line because a conductive line to which a data signal is input functions as a lower layer data line, not an upper layer data line.

Also in the non-connection mode, a plurality of the gate lines may be disposed, one of the lower layer data line and the upper layer data line may be linearly disposed to horizontally or vertically cross the array region, and the other may be disposed in a region between adjacent gate lines without overlapping the gate lines.

The upper layer gate electrode is preferably disposed on the semiconductor layer with the second insulating film in between, and the second insulating film is preferably not disposed on the semiconductor layer except for the region in which the upper layer gate electrode is disposed. This structure enables use of the upper layer gate electrode and the second insulating film as masks in formation of a conduction imparted portion through the resistance reduction treatment on the semiconductor layer, achieving a self-alignment TFT structure. The structure can also reduce by one the number of insulating films used to connect the upper layer data line to the semiconductor layer in a portion such as a contact hole, as compared with the case where the second insulating film covers the semiconductor layer. Here, the expression "the second insulating film is not disposed on the semiconductor layer except for the region in which the upper layer gate electrode is disposed" includes the case where the second insulating film is substantially considered as not being disposed on the semiconductor layer except for the region in which the upper layer gate electrode is disposed. For example, the expression includes the case where the tapered portion on the side surface of the second insulating film extends along the tapered portion on the side surface of the upper layer gate electrode and protrudes from the shape of the upper layer gate electrode.

The second insulating film preferably has the same planar shape as the second line layer including the upper layer gate electrode. This structure enables patterning the second insulating film using the same mask as that used to pattern the second line layer, reducing the number of masks used in the production process. The expression "the second insulating film has the same planar shape as the second line layer including the upper layer gate electrode" includes the case where the second insulating film has substantially the same planar shape as the second line layer including the upper layer gate electrode. For example, the expression includes the case where a difference in planar shape generated in patterning the second insulating film and the second line layer using the same mask is also generated between the second insulating film and the second line layer.

The liquid crystal display devices of the embodiments of the present invention each include the TFT substrate.

The organic EL display devices (OLEDs) of the embodiments of the present invention each include the TFT substrate.

Preferably, the TFT substrate included in the organic EL display devices further includes anode side power lines disposed in the third line layer and intersecting the lower layer data line and the upper layer data line is disposed in a region between adjacent anode side power lines. This structure can give a redundant structure to the data lines using the line layer in which the anode side power lines are disposed.

The application of the TFT substrate is not particularly limited. Yet, the TFT substrate is preferably a substrate for display devices as described above, particularly preferably a substrate constituting a thin display panel.

Hereinafter, the thin-film transistor substrates, the liquid crystal display devices, and the organic electroluminescent display devices of other embodiments of the present invention are described in more detail with reference to the drawings. In the following description, members having the same or similar functions in different drawings are commonly provided with the same reference sign so as to avoid repetition of description.

Embodiment 1

Figure 2:
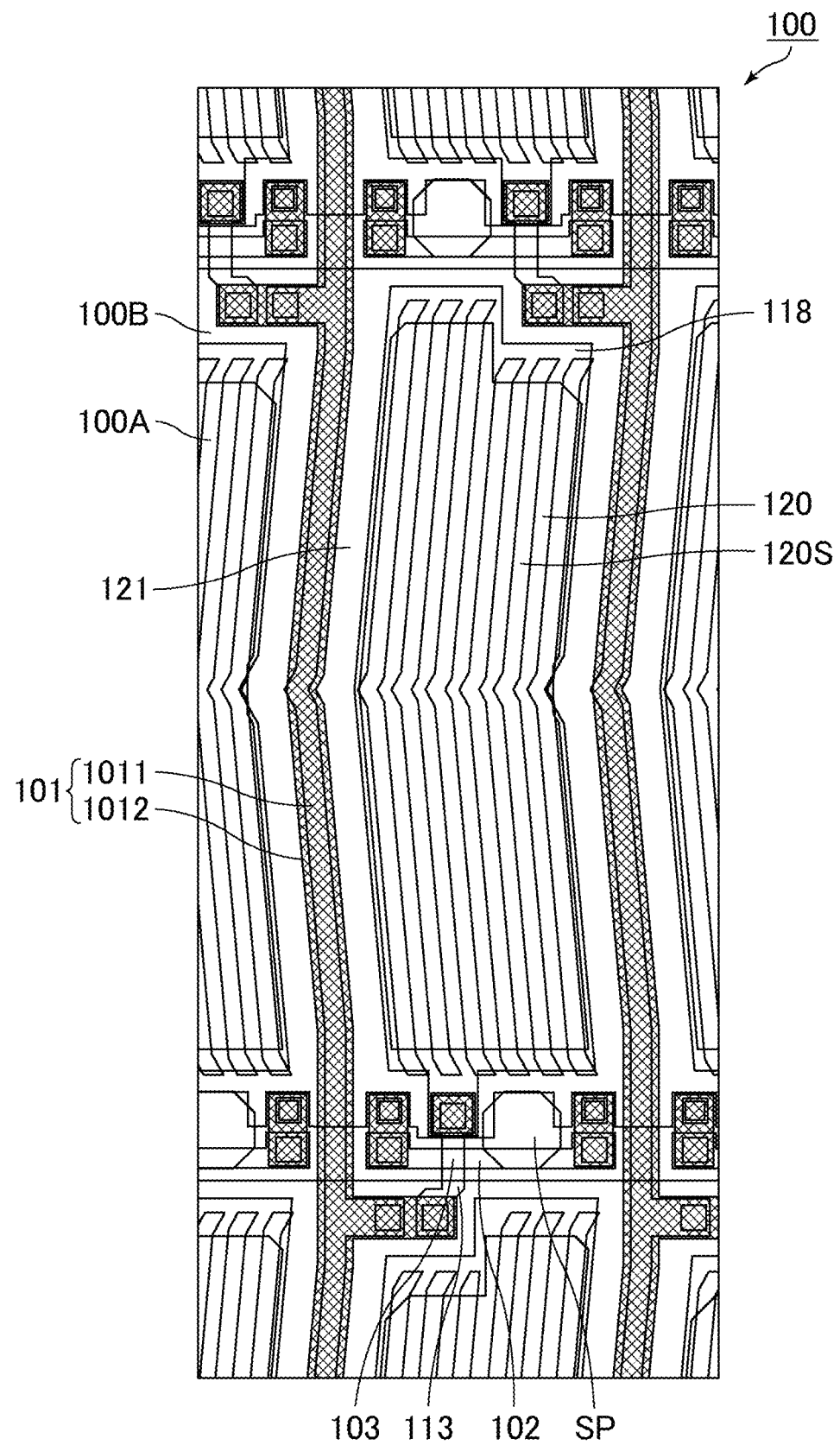
FIG. 2 is a schematic plan view of a liquid crystal display device of Embodiment 1, with a third line layer highlighted.

FIG. 1 is a schematic plan view of a liquid crystal display device of Embodiment 1, with a first line layer and a second line layer highlighted. FIG. 2 is a schematic plan view of a liquid crystal display device of Embodiment 1, with a third line layer highlighted. FIG. 1 shows the third line layer with thick lines. FIG. 2 shows the third line layer with grid-like hatching.

As shown in FIG. 1 and FIG. 2, the liquid crystal display device 100 of the present embodiment includes a thin-film transistor substrate (hereinafter, TFT substrate) 100A, a counter substrate 100B facing the TFT substrate 100A, and a liquid crystal layer (not shown) between the TFT substrate 100A and the counter substrate 100B. The TFT substrate 100A in the present embodiment is also referred to as an array substrate.

The liquid crystal display device 100 includes a first alignment film (not shown) between the TFT substrate 100A and the liquid crystal layer; a second alignment film (not shown) between the counter substrate 100B and the liquid crystal layer; a first polarizing plate (not shown) on the surface remote from the liquid crystal layer of the TFT substrate 100A; a second polarizing plate (not shown) on the surface remote from the liquid crystal layer of the counter substrate 100B; and a backlight (not shown) on the surface remote from the liquid crystal layer of the first polarizing plate. The first polarizing plate and the second polarizing plate are in crossed Nicols in which their polarization axes are perpendicular to each other.

The TFT substrate 100A includes data lines 101, gate lines 102 intersecting the data lines 101, and thin-film transistors (hereinafter, TFTs) 103 serving as switching elements. Each data line consists of a lower layer data line 1011 and an upper layer data line 1012 disposed in different layers.

In each region surrounded by two adjacent data lines 101 and two adjacent gate lines 102 is disposed a pixel electrode 118. Each pixel electrode 118 is connected to the corresponding data line 101 via the semiconductor layer of the corresponding TFT 103. A common electrode 120 provided with slits (openings) 120S is formed on the pixel electrodes 118 with a second protective film (not shown in FIG. 1) serving as a fourth insulating film in between to cover substantially the entire display region except for the slits 120S.

The liquid crystal display device 100 further includes a source driver (not shown) connected to the data lines 101, a gate driver (not shown) connected to the gate lines 102, and a controller (not shown). The gate driver sequentially supplies scanning signals to the gate lines 102 based on the control by the controller. The source driver supplies data signals to the data lines 101 based on the control by the controller when the corresponding TFTs 103 are in the voltage applied state according to the scanning signals. Each pixel electrode 118 is set at a potential according to the data signal supplied thereto through the corresponding TFT 103, so that a fringe electric field is generated between the pixel electrode 118 and the common electrode and thereby the liquid crystal molecules in the liquid crystal layer are rotated. In this manner, the magnitude of voltage applied between each pixel electrode 118 and the common electrode is controlled to change the retardation in the liquid crystal layer, whereby transmission and blocking of light is controlled. The liquid crystal display device 100 of the present embodiment is a fringe field switching (FFS) mode liquid crystal display device. In the present embodiment, a 16.1-inch FHD display or a 32.2-inch 4K display (with a dot pitch equivalent to 62 μm×186 μm) is assumed to be in the FFS mode.

The present embodiment is described using an exemplary FFS mode liquid crystal display device, but the liquid crystal driving mode of the liquid crystal display device is not particularly limited. Examples of the liquid crystal driving mode other than the FFS mode include liquid crystal driving modes such as the twisted nematic (TN) mode and the vertical alignment (VA) mode.

In the TN mode, the pixel electrodes 118 are disposed on the TFT substrate 100A, the common electrode 120 is disposed on the counter substrate 100B, and in the liquid crystal layer, liquid crystal molecules are aligned with the alignment of the liquid crystal molecules, rotating in one direction, being twisted by 90° from the pixel electrode 118 side to the common electrode 120 side.

In the VA mode, the pixel electrodes 118 are disposed on the TFT substrate 100A, the common electrode 120 is disposed on the counter substrate 100B, and negative liquid crystals are aligned perpendicular to the substrate surface in the liquid crystal layer with no voltage applied between the pixel electrodes 118 and the common electrode 120.

The counter substrate 100B includes, sequentially toward the liquid crystal layer, an insulating substrate (not shown), a black matrix layer 121, and a color filter layer (not shown). In the light-shielding region in which the black matrix layer 121 is disposed are provided spacers SP, which maintain the cell gap to the given thickness. The color filter layer includes red color filters, green color filters, and blue color filters, and has a structure in which these color filters are partitioned by the black matrix layer 121.

Figure 3:
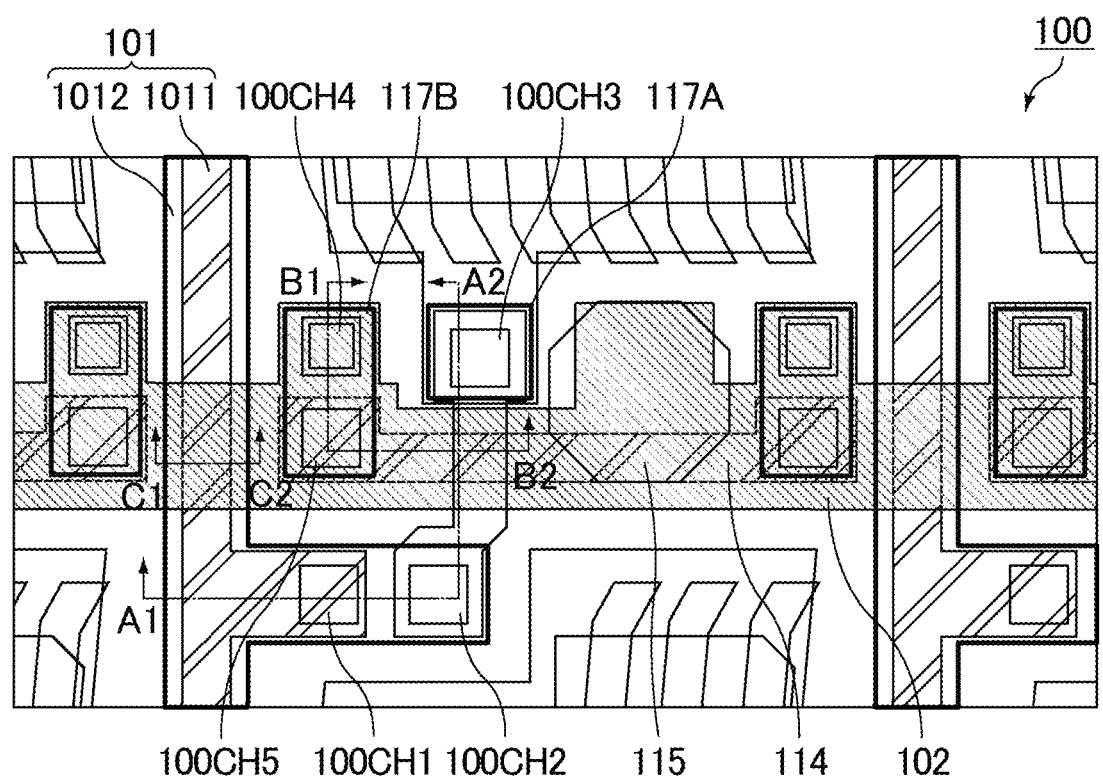
FIG. 3 is an enlarged schematic plan view of the region surrounded by the dashed line in FIG. 1.
Figure 4:
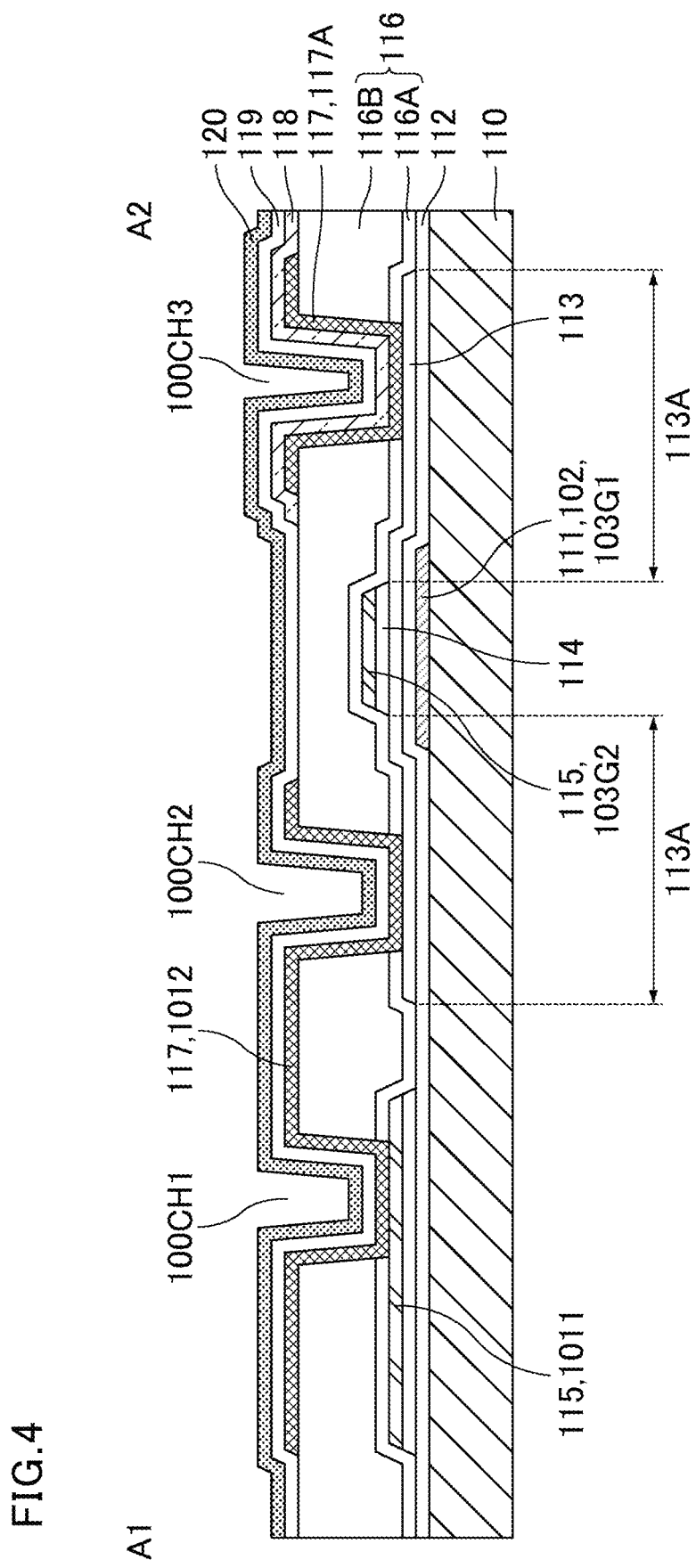
FIG. 4 is a schematic cross-sectional view of a TFT substrate in the liquid crystal display device of Embodiment 1.
Figure 5:
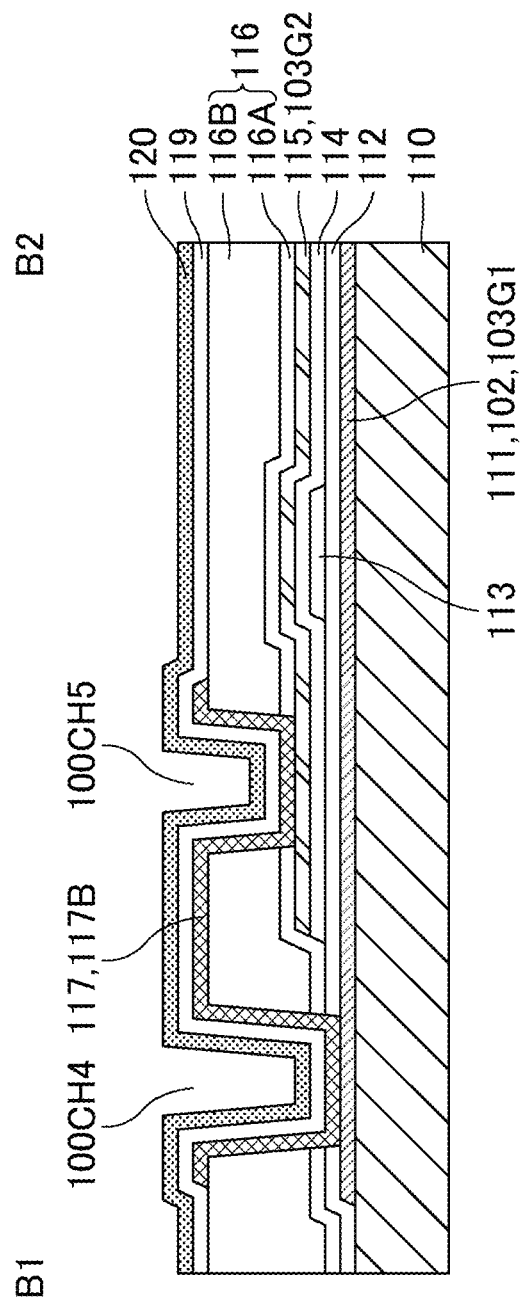
FIG. 5 is another schematic cross-sectional view of the TFT substrate in the liquid crystal display device of Embodiment 1.
Figure 6:
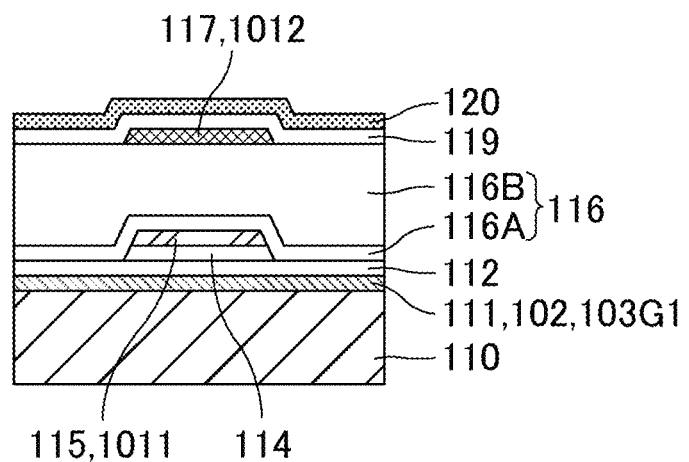
FIG. 6 is yet another schematic cross-sectional view of the TFT substrate in the liquid crystal display device of Embodiment 1.

FIG. 3 is an enlarged schematic plan view of the region surrounded by the dashed line in FIG. 1. FIGS. 4 to 6 are schematic cross-sectional views of a TFT substrate in the liquid crystal display device of Embodiment 1. FIG. 3 shows the third line layer with thick lines. FIGS. 4 to 6 show the cross sections taken along the line A1-A2, the line B1-B2, and the line C1-C2 in FIG. 3, respectively.

As shown in FIGS. 3 to 6, the TFT substrate 100A includes, on the insulating substrate 110, a stack sequentially including a first line layer 111, a lower layer insulating film 112 as a first insulating film, a semiconductor layer 113, a gate insulating film 114 as a second insulating film, a second line layer 115, a first protective film 116 as a third insulating film, a third line layer 117, a pixel electrode 118 (first transparent conductive film), a second protective film 119 as a fourth insulating film, and a common electrode 120 (second transparent conductive film). Each TFT 103 includes a lower layer gate electrode 103G1 in the first line layer 111, a semiconductor layer 113, and an upper layer gate electrode 103G2 in the second line layer 115. Each gate line 102 is disposed in the first line layer 111 and connected to the lower layer gate electrodes 103G1. Each data line 101 includes a lower layer data line 1011 in the second line layer 115 and an upper layer data line 1012 in the third line layer 117. The gate lines 102 cross the lower layer data lines 1011 and the upper layer data lines 1012.

In other words, the TFT substrate 100A includes the lower layer gate electrodes 103G1 formed on the insulating substrate 110, the semiconductor layer 113 formed in an upper layer relative to the lower layer gate electrodes 103G1 with the lower layer insulating film 112 in between, the upper layer gate electrodes 103G2 formed in an upper layer relative to the semiconductor layer 113 with the gate insulating film 114 in between, and the first protective film 116 formed in an upper layer relative to the upper layer gate electrodes 103G2. The gate lines 102 are formed in the same layer as the lower layer gate electrodes 103G1. The data lines 101 are each formed as a stack of a lower layer data line 1011 in the same layer as the upper layer gate electrodes 103G2 and an upper layer data line 1012 in the third line layer 117 on the first protective film 116.

This structure can reduce the capacitance at the intersections between the data lines 101 and the gate lines 102 and reduce or eliminate gate signal dullness due to the capacitance. Also, the data lines 101 can have a redundant structure (can be multilayer lines), which can increase the yield of especially large, high-definition panels.

Figure 18:
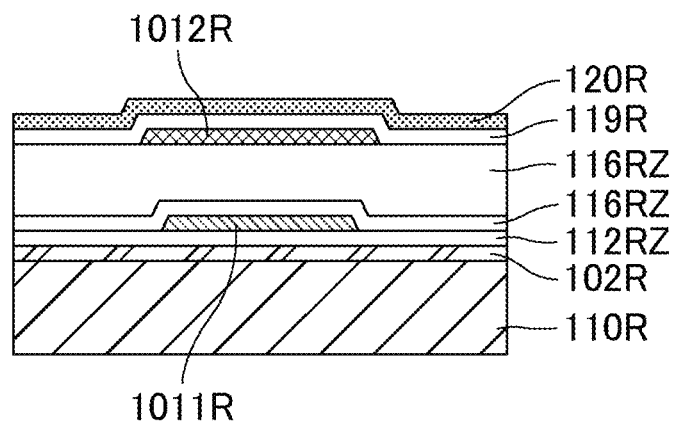
FIG. 18 is a schematic cross-sectional view of a TFT substrate in a liquid crystal display device of Comparative Embodiment 2.

FIG. 18 is a schematic cross-sectional view of the TFT substrate in a liquid crystal display device of Comparative Embodiment 2. As shown in FIG. 18, the TFT substrate in the liquid crystal display device of Comparative Embodiment 2 has a structure obtained by removing the second insulating film (gate insulating film) and the upper layer gate electrodes from the TFT substrate of the present embodiment shown in FIG. 6. The TFT substrate in the liquid crystal display device of Comparative Embodiment 2 includes, on the insulating substrate 110R, a stack sequentially including the gate lines 102R, a first insulating film 112RZ, the lower layer data lines 1011R, a third insulating film 116RZ having a stack structure, the upper layer data lines 1012R, the second protective film 119R, and the common electrode 120R. Thus, the TFT substrate includes data lines having a redundant structure. Other modes in which the double gate TFTs are employed and the data lines have a redundant structure include, based on the structure in FIG. 18, the following mode in Comparative Embodiment 3 as well as the present embodiment.

Figure 19:
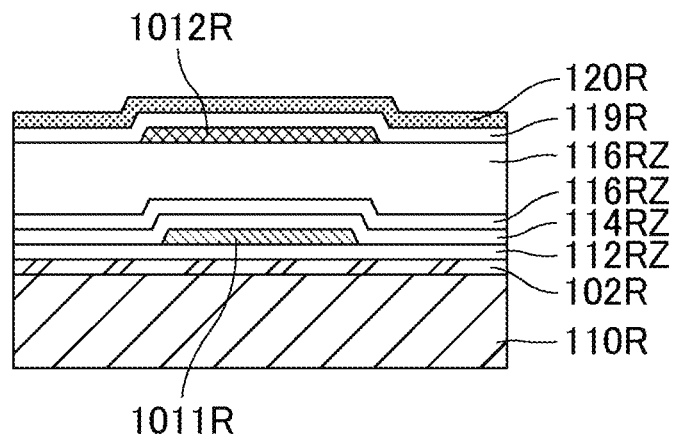
FIG. 19 is a schematic cross-sectional view of a TFT substrate in a liquid crystal display device of Comparative Embodiment 3.

FIG. 19 is a schematic cross-sectional view of a TFT substrate in a liquid crystal display device of Comparative Embodiment 3. As shown in FIG. 19, the TFT substrate in the liquid crystal display device of Comparative Embodiment 3 includes, on the insulating substrate 110R, a stack sequentially including the gate lines 102R, the first insulating film 112RZ, the lower layer data lines 1011R, a second insulating film 114RZ, the upper layer gate electrodes (not shown), the third insulating film 116RZ having a stack structure, the upper layer data lines 1012R, the second protective film 119R, and the common electrode 120R. The lower layer data lines 1011R and the upper layer gate electrodes are formed in different layers. In contrast, the TFT substrate 100A in the present embodiment shown in FIG. 6 includes the lower layer data lines 1011 and the upper layer gate electrodes 103G2 in the same layer and no additional electrode layer is required. Also, the TFT substrate in Comparative Embodiment 3 includes only one insulating film (first insulating film 112RZ) between the gate lines 102R and the lower layer data lines 1011R. In contrast, the TFT substrate 100A in the present embodiment includes, as shown in FIG. 6, two insulating films (lower layer insulating film 112 and gate insulating film 114) between the gate lines 102 and the lower layer data lines 1011, which enables reduction in capacitance between the data lines 101 and the gate lines 102.

Figure 10:
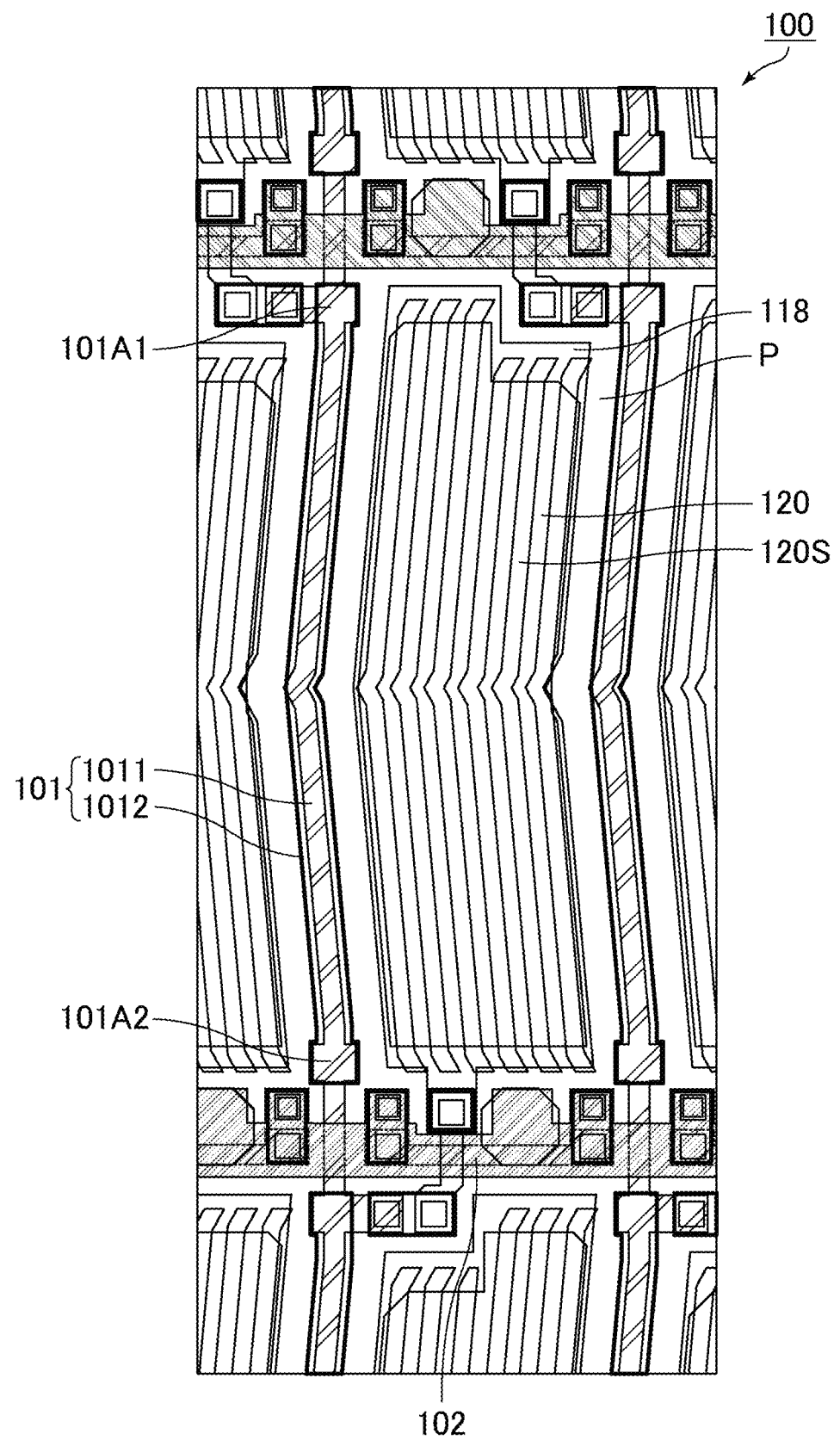
FIG. 10 is a schematic plan view of a liquid crystal display device of Embodiment 3.

JP 2013-251526 A does not disclose in FIG. 10 a structure in which a data line is formed as a stack of a layer in the same layer as the upper layer (upper) gate electrodes and a third line layer on the first protective film.

Each TFT 103 in the present embodiment is a double gate TFT including the semiconductor layer 113 between its lower layer gate electrode 103G1 and upper layer gate electrode 103G2. The lower layer gate electrodes 103G1 function also as a channel light-shielding film.

The upper layer gate electrode 103G2 is disposed on the semiconductor layer 113 with the gate insulating film 114 in between. The gate insulating film 114 is not disposed on the semiconductor layer 113 except for the region in which the upper layer gate electrode 103G2 is disposed. This structure enables use of the upper layer gate electrode 103G2 and the gate insulating film 114 as masks to form a conduction imparted portion 113A through the resistance reduction treatment on the semiconductor layer 113, achieving a self-alignment TFT structure. Also, this structure can reduce by one the number of insulating films in portions such as the contact hole 100CH2 for connecting the upper layer data line 1012 and the semiconductor layer 113 and the contact hole 100CH3 for connecting a later-described connection electrode 117A and the semiconductor layer 113, as compared with the case where the gate insulating film 114 covers the semiconductor layer 113. Each TFT 103 is assumed to, but not limited to, have a self-alignment structure in which the gate insulating film 114 is patterned and the semiconductor layer 113 is subjected to the resistance reduction (conduction imparting) treatment in the pattern of the upper layer gate electrodes 103G2.

As shown in FIGS. 1 and 2, each upper layer gate electrode 103G2 and the corresponding lower layer gate electrode 103G1 are on the upper and lower sides of the semiconductor layer 113, respectively, with an insulating film in between. One of the upper layer gate electrode 103G2 and the lower layer gate electrode 103G1 (e.g., lower layer gate electrode 103G1) at least overlaps the other (e.g., upper layer gate electrode 103G2) in a region where at least the semiconductor layer 113 is disposed in a plan view.

In the figures such as FIG. 1 and FIG. 2, each upper layer data line 1012 has a greater thickness than the lower layer data lines 1011, but may be designed to have a smaller thickness than the lower layer data lines 1011 such that the capacitance between the data lines 101 and the gate lines 102 does not increase. The width of the upper layer data line 1012 can appropriately be determined based on the conditions such as the likelihood that an open circuit occurs, the thickness of the second protective film 119 (capacitance between the data lines 101 and the common electrode 120), and the material of the data lines 101 (resistance reduction effect).

As shown in FIG. 4, each lower layer data line 1011 and the corresponding upper layer data line 1012 are connected to each other in the corresponding contact hole 100CH1 as a first opening in the first protective film 116 near the corresponding TFT 103. The upper layer data line 1012 is connected to the corresponding source region of the semiconductor layer 113 in the corresponding contact hole 100CH2 as a second opening in the first protective film 116. Here, the two contact holes 100CH1 and 100CH2 as shown in FIG. 4 may not be formed, and one contact hole may be formed to overlap both the lower layer data line 1011 and the source region of the semiconductor layer 113.

Each pixel electrode 118 is connected to the corresponding drain region of the semiconductor layer 113 in the corresponding contact hole 100CH3 as a third opening in the first protective film 116. The pixel electrode 118 may also be connected to the drain region of the semiconductor layer 113 via the corresponding connection electrode 117A in the third line layer 117. Although some production processes may expose the surface of the drain regions of the semiconductor layer 113 to etching without the connection electrodes 117A constituting the pattern of the third line layer 117, the connection electrodes 117A, when disposed, can function as a protective film during etching.

To each data line 101 is input data signals from the source driver in the liquid crystal display device 100. The source driver may input a data signal to each of the lower layer data line 1011 and the upper layer data line 1012 or one of the lower layer data line 1011 and the upper layer data line 1012. In the case where the source driver inputs a data signal to one of the lower layer data line 1011 and the upper layer data line 1012, the lower layer data line 1011 and the upper layer data line 1012 are preferably connected to each other at least at two sites.

As shown in FIG. 5, each lower layer gate electrode 103G1 and the corresponding upper layer gate electrode 103G2 are connected to each other via a switching electrode 117B in the third line layer 117. As described above, each TFT 103 includes a lower layer gate electrode 103G1 formed on the insulating substrate 110, the semiconductor layer 113 formed in an upper layer relative to the lower layer gate electrode 103G1 with the lower layer insulating film 112 in between, an upper layer gate electrode 103G2 formed in an upper layer relative to the semiconductor layer 113 with the gate insulating film 114 in between, and the first protective film 116 formed in an upper layer relative to the upper layer gate electrode 103G2, wherein the lower layer gate electrode 103G1 and the upper layer gate electrode 103G2 are connected to each other via the third line layer 117 on the first protective film 116.

A switching electrode 117B in the third line layer 117 is connected to the corresponding lower layer gate electrode 103G1 in the corresponding contact hole 100CH4 as a fourth opening in the first protective film 116 and the lower layer insulating film 112, and connected to the corresponding upper layer gate electrode 103G2 in the corresponding contact hole 100CH5 as a fifth opening in the first protective film 116. In the present embodiment, a switching electrode connecting the upper layer gate electrode 103G2 and the lower layer gate electrode 103G1 is the third line layer 117 as in the case of the upper layer data lines 1012.

In the TFT substrate 100A, the lower layer gate electrode 103G1 is disposed in the first line layer 111, which is the first conductive layer, and the upper layer gate electrode 103G2 is disposed in the second line layer 115, which is the second conductive layer. The lower layer gate electrode 103G1 and the upper layer gate electrode 103G2 are connected to each other via the corresponding switching electrode 117B in the third line layer 117 on the first protective film 116 as the third insulating film. Thus, contact holes 100CH4 can be formed in the lower layer insulating film 112 as the first insulating film using the photomask used to pattern the first protective film 116. In other words, a specialized photomask to form contact holes 100CH4 in the lower layer insulating film 112 is not necessary, so that the number of photomasks used in the production process can be reduced.

As shown in FIGS. 1 and 2, in the present embodiment, the upper layer gate electrode 103G2 and the lower layer gate electrode 103G1 are switched at two sites in the pixel. Specifically, the lower layer gate electrode 103G1 and the upper layer gate electrode 103G2 are connected to each other via the switching electrode 117B at each side of the semiconductor layer 113 (each channel width direction side of the semiconductor layer 113). This structure can give a redundant structure to the gate lines 102 as well.

As shown in FIG. 6, no gate line 102 is disposed between the lower layer data line 1011 and the upper layer data line 1012. Thus, the data lines 101 can have a redundant structure (can be multilayer lines) while gate signal dullness due to the capacitance at the intersection between the lower layer data line 1011 and the upper layer data line 1012 is reduced or eliminated, so that the yield of especially large, high-definition panels can be increased.

The insulating substrate 110 is a substrate having insulation properties. Examples of the insulating substrate 110 include transparent substrates such as glass substrates and plastic substrates.

The conductive lines and electrodes in the first line layer 111, the second line layer 115, and the third line layer 117 can be formed by forming a single-layer or multi-layer film from a metal such as copper, titanium, aluminum, molybdenum, or tungsten, or an alloy thereof by a method such as sputtering, and then patterning the film by a method such as photolithography.

The semiconductor layer 113 can be formed from an oxide semiconductor, such as an InGaZnO-based oxide semiconductor.

The lower layer insulating film 112, the gate insulating film 114, the first protective film 116, and the second protective film 119 can each be an inorganic insulating film, an organic insulating film, or a stack of an organic insulating film and an inorganic insulating film. The inorganic insulating film can be, for example, an inorganic film such as a silicon nitride ($SiN_x$) or silicon oxide ($SiO_2$) film, or a stack of such films. The organic insulating film can be, for example, a photosensitive organic film such as a photosensitive acrylic resin film.

In the present embodiment, the lower layer insulating film 112, the gate insulating film 114, and the second protective film 119 are each an inorganic insulating film, and the first protective film 116 is a stack of the inorganic insulating film 116A and the photosensitive organic film (organic insulating film) 116B. Specifically, the lower layer insulating film 112 is a $SiO_2$ layer, the gate insulating film 114 is a $SiO_2$ layer, the second protective film 119 is a $SiN_x$ layer, and the first protective film 116 is a stack sequentially including a $SiO_2$ layer and a photosensitive organic film from the insulating substrate 110 side.

The pixel electrodes 118 and the common electrode 120 can be formed by, for example, forming a single-layer or multiple-layer film from a transparent conductive material such as indium tin oxide (ITO), indium zinc oxide (IZO), zinc oxide (ZnO), or tin oxide (SnO), or an alloy thereof by a method such as sputtering, and then patterning the film by photolithography.

Figure 7:
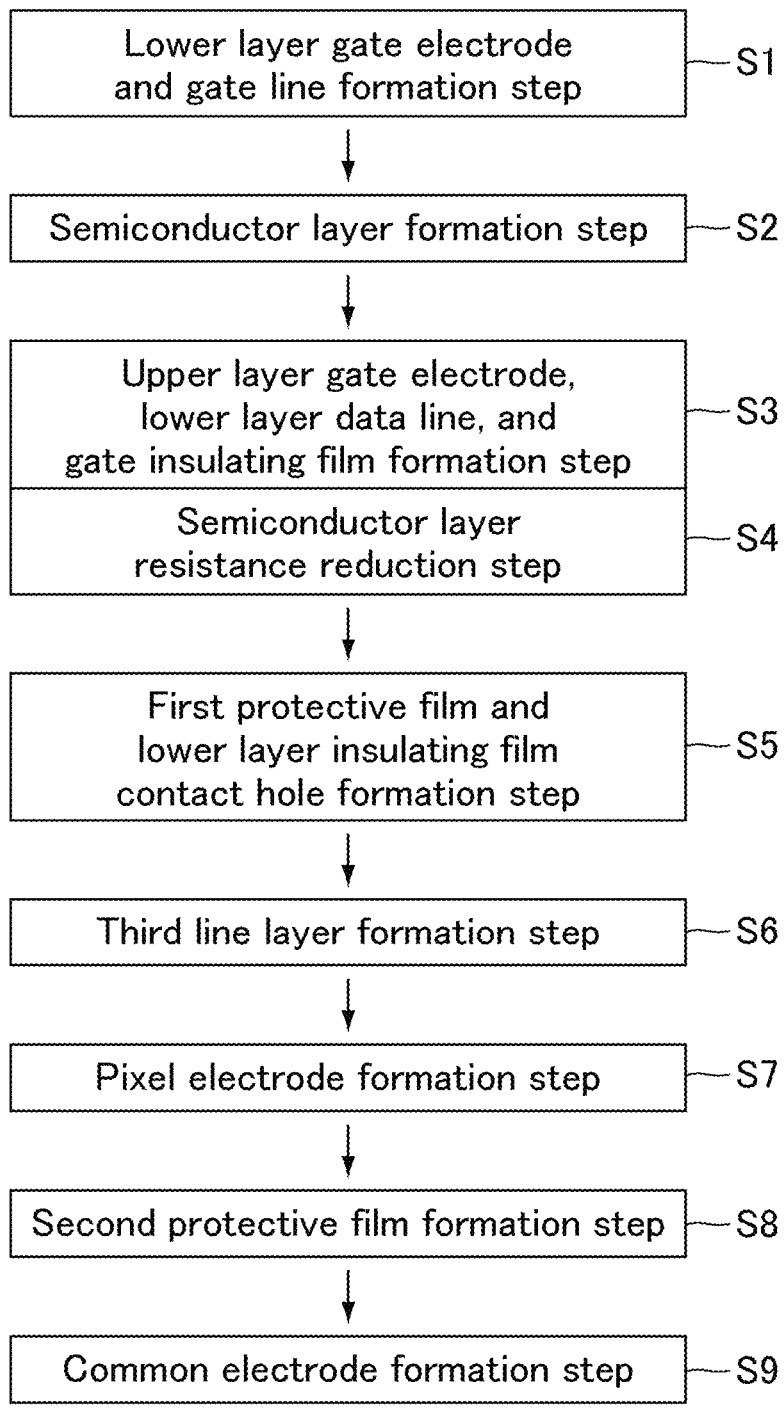
FIG. 7 is a view showing the production process of the TFT substrate in the liquid crystal display device of Embodiment 1.

FIG. 7 is a view showing the production process of the TFT substrate in the liquid crystal display device of Embodiment 1. The production process of the liquid crystal display device 1 of the present embodiment is described with reference to FIG. 7.

In a lower layer gate electrode and gate line formation step S1, a first conductive film is formed on an insulating substrate by sputtering, and a resist pattern is formed by photolithography using a photomask. The first conductive film is patterned by etching using the resist pattern as a mask. The resist pattern is then removed, so that the first line layer 111 including the lower layer gate electrodes 103G1 and the gate lines 102 is formed.

In a semiconductor layer formation step S2, the lower layer insulating film 112 is formed on the first line layer 111 by chemical vapor deposition (CVD), a semiconductor film is formed by sputtering, and a resist pattern is formed by photolithography using a photomask. The semiconductor film is patterned by etching using the resist pattern as a mask. The resist pattern is then removed, so that the lower layer insulating film 112 and the semiconductor layer 113 are formed.

In an upper layer gate electrode, lower layer data line, and gate insulating film formation step S3, the gate insulating film 114 is formed on the semiconductor layer 113 by CVD, a second conductive film is formed by sputtering, and a resist pattern is formed by photolithography using a photomask. The second conductive film is patterned by etching using the resist pattern as a mask, so that the second line layer 115 including the upper layer gate electrodes 103G2 and the lower layer data lines 1011 is formed. The gate insulating film 114 is patterned by etching also using the above resist pattern, followed by removal of the resist pattern. In this manner, in the production process employed in the present embodiment, formation of the second line layer 115 and patterning of the gate insulating film 114 can be performed in the same step. Also in the present embodiment, as shown in FIG. 3, the second line layer 115 including the upper layer gate electrodes 103G2 and the gate insulating film 114 are formed to have substantially the same planar shape, and the region where the second line layer 115 is formed and the region where the gate insulating film 114 is formed are substantially the same.

In a semiconductor layer resistance reduction step S4, the semiconductor layer 113 is subjected to the resistance reduction treatment using the upper layer gate electrodes 103G2 and the gate insulating film 114 overlapping the upper layer gate electrodes 103G2 as masks so as to form conduction imparted portions 113A (source regions and drain regions). The semiconductor layer 113 except for the conduction imparted portions 113A functions as a channel region.

In a first protective film and lower layer insulating film contact hole formation step S5, the inorganic insulating film 116A is formed on the second line layer 115 by CVD. A photosensitive organic film material is applied to the inorganic insulating film 116A by spin coating or slit coating, and the material is patterned by photolithography using a photomask, so that the photosensitive organic film 116B is formed. The inorganic insulating film 116A is etched in the pattern of the photosensitive organic film 116B to form contact holes in the inorganic insulating film 116A, and then the lower layer insulating film 112 is etched also in the pattern of the photosensitive organic film 116B to form contact holes in the lower layer insulating film 112. In this manner, in the production process employed in the present embodiment, formation of contact holes in the inorganic insulating film 116A and formation of contact holes in the lower layer insulating film 112 can be performed in the same step. This step forms the contact holes 100CH4 shown in the figures including FIG. 3, and connects the lower layer gate electrodes 103G1 and the respective upper layer gate electrodes 103G2 via the third line layer 117.

In a third line layer formation step S6, a third conductive film is formed on the photosensitive organic film 116B by sputtering, and a resist pattern is formed by photolithography using a photomask. The third conductive film is patterned by etching using the resist pattern as a mask. The resist pattern is then removed, so that the third line layer 117 including the upper layer data lines 1012 is formed.

In a pixel electrode formation step S7, a first transparent conductive film is formed on the third line layer 117 by sputtering, and a resist pattern is formed by photolithography using a photomask. The first transparent conductive film is patterned by etching using the resist pattern as a mask. The resist pattern is then removed, so that the pixel electrodes 118 are formed.

In a second protective film formation step S8, the second protective film 119 is formed on the pixel electrodes 118 by CVD, and a resist pattern is formed by photolithography using a photomask. The second protective film 119 is patterned by etching using the resist pattern as a mask, so that contact holes are formed in the second protective film 119.

In a common electrode formation step S9, a second transparent conductive film is formed on the second protective film 119 by sputtering, and a resist pattern is formed by photolithography using a photomask. The second transparent conductive film is patterned by etching using the resist pattern as a mask. The resist pattern is then removed, so that the common electrode 120 is formed.

In the production process of the liquid crystal display device 1 of the present embodiment, as described for the upper layer gate electrode, lower layer data line, and gate insulating film formation step S3 in FIG. 7, the gate insulating film 114 can be patterned in the same step as the step of forming the second line layer 115. Also, as described for the first protective film and lower layer insulating film contact hole formation step S5 in FIG. 7, after formation of contact holes in the inorganic insulating film 116A by etching the inorganic insulating film 116A in the pattern of the photosensitive organic film 116B, contact holes can be formed in the lower layer insulating film 112 by etching the lower layer insulating film 112 in the patterns of the inorganic insulating film 116A and the photosensitive organic film 116B. This eliminates the specialized photolithography steps (photomasks) to form contact holes at least in the lower layer insulating film 112 and the gate insulating film 114. Also, contact holes in the lower layer insulating film 112 can be formed without fail.

Furthermore, in the semiconductor layer resistance reduction step S4, the conduction imparted portions 113A are formed by the resistance reduction treatment on the semiconductor layer 113 using the gate insulating film 114 and the upper layer gate electrodes 103G2 as masks. Here, the gate insulating film 114 and the upper layer gate electrodes 103G2 can be patterned in the same step (upper layer gate electrode, lower layer data line, and gate insulating film formation step S3), and TFTs (double gate TFTs) in which gate electrodes are formed in the upper and lower layers of the channel region can be produced, whereby TFTs exhibiting stable performance in the on and off states.

Modified Example of Embodiment 1

Figure 8:
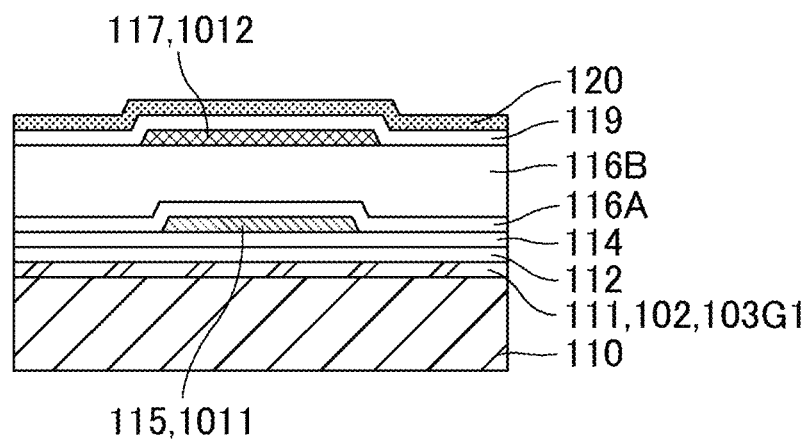
FIG. 8 is a schematic cross-sectional view of a TFT substrate in a liquid crystal display device of a modified example of Embodiment 1.

FIG. 8 is a schematic cross-sectional view of a TFT substrate in a liquid crystal display device of a modified example of Embodiment 1. In Embodiment 1, the self-alignment mode is described in which in a plan view, no gate insulating film 114 is disposed in part of the region where the semiconductor layer 113 is disposed, the gate insulating film 114 and each upper layer gate electrode 103G2 overlap each other in part of the region where the semiconductor layer 113 is disposed, and one end and the other end of the gate insulating film 114 in the channel length direction of the semiconductor layer 113 are at the same positions as one end and the other end of the upper layer gate electrode 103G2, respectively. Yet, the one end and the other end of the gate insulating film 114 in the channel length direction of the semiconductor layer 113 may be disposed on the outer side relative to the one end and the other end of the upper layer gate electrode 103G2, respectively. For example, the gate insulating film 114 may not be patterned in substantially the same shape as the upper layer gate electrode 103G2 but may cover the lower layer insulating film 112. In this case, for example, as shown in FIG. 8, the gate insulating film 114 may be disposed under the lower layer data lines 1011. As described above, Embodiment 1 is also applicable to liquid crystal display devices having a TFT structure other than the self-alignment TFT structure.

Embodiment 2

In the present embodiment, features unique to the present embodiment are mainly described, and the same features as those in the above embodiment are not described again. The present embodiment is supposed to employ a structure with an FFS mode liquid crystal display device as in the above embodiment. In Embodiment 1, each upper layer gate electrode and the corresponding lower layer gate electrode are connected to each other via the switching electrode in the third line layer. In the present embodiment, the upper layer gate electrode and the lower layer gate electrode are connected to each other via no third line layer.

Figure 9:
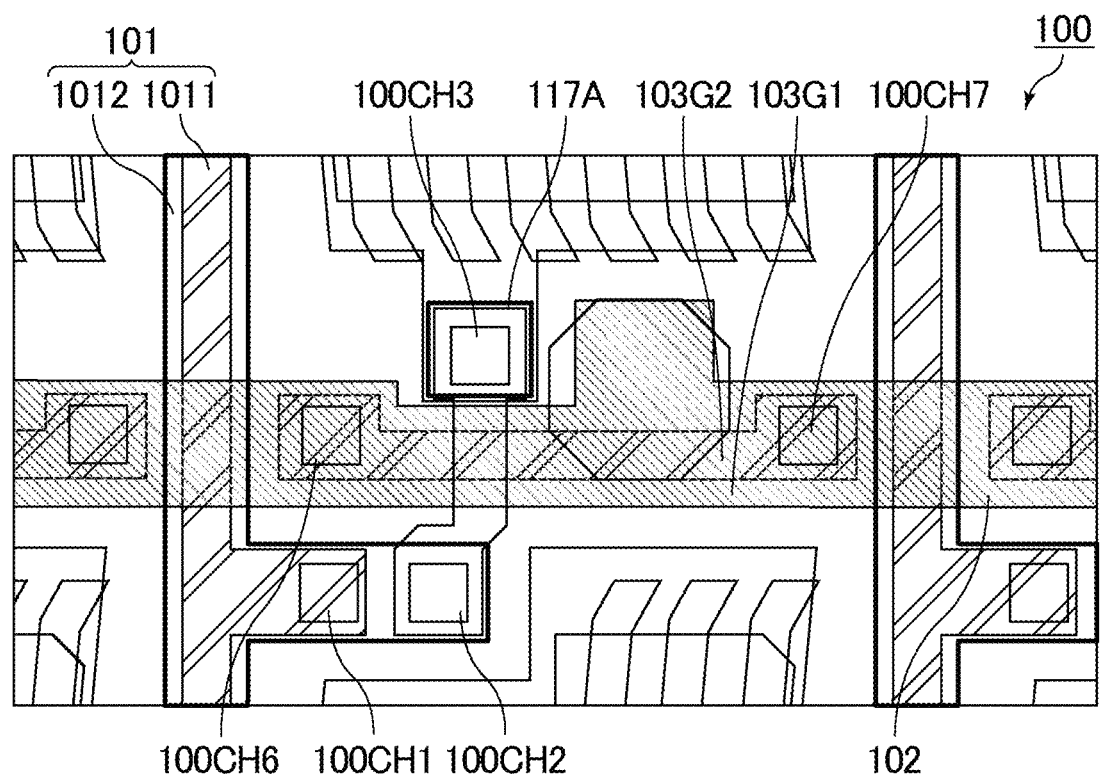
FIG. 9 is a schematic plan view of a liquid crystal display device of Embodiment 2.

FIG. 9 is a schematic plan view of a liquid crystal display device of Embodiment 2. FIG. 9 shows the third line layer with thick lines. As shown in FIG. 9, each lower layer gate electrode 103G1 and the corresponding upper layer gate electrode 103G2 in the present embodiment are directly connected to each other in the corresponding contact hole 100CH6 as a sixth opening in the lower layer insulating film 112 and the gate insulating film 114 and in the corresponding contact hole 100CH7 as a seventh opening in the lower layer insulating film 112 and the gate insulating film 114.

This structure in the present embodiment eliminates the need for the switching electrodes 117B in the liquid crystal display device 100 of Embodiment 1 and can thereby reduce the electrodes to be disposed on the side closer to the liquid crystal layer, reducing the parasitic capacitance between the pixel electrodes 118 and the common electrode 120.

The contact holes 100CH6 and 100CH7 are formed at each side of the semiconductor layer 113 (each channel width direction side of the semiconductor layer 113). This structure can reduce the resistance of the gate lines 102 and increase the redundancy of the gate lines 102.

Embodiment 3

In the present embodiment, features unique to the present embodiment are mainly described, and the same features as those in the above embodiments are not described again. The present embodiment is supposed to employ a structure with an FFS mode liquid crystal display device as in the above embodiments. In Embodiment 1, each lower layer data line and the corresponding upper layer data line are connected to each other in advance. In the present embodiment, the lower layer data line and the upper layer data line are not connected to each other in advance.

FIG. 10 is a schematic plan view of a liquid crystal display device of Embodiment 3. FIG. 10 shows the third line layer with thick lines. As shown in FIG. 10, the upper layer data lines 1012 are separate (independent) in respective pixels P, and are not connected to the corresponding lower layer data lines 1011 connected to the TFTs 103. When a lower layer data line 1011 is open-circuited, the circuit can be closed by irradiating overlap portions (two sites) 101A1 and 101A2 between the lower layer data line 1011 and the corresponding upper layer data line 1012 with a laser beam from the insulating substrate 110 side and thereby connecting the lower layer data line 1011 and the upper layer data line 1012 to each other.

In the present embodiment in which the lower layer data line 1011 and the upper layer data line 1012 are not connected to each other in advance, the lower layer data line 1011 connected to the TFT 103 is disposed in the second line layer 115 and the upper layer data line 1012 is disposed in the third line layer 117, so that the lower layer data line 1011 to which a data signal is to be input is disposed on the side more remote from the liquid crystal layer. This enables reduction in parasitic capacitance between the data lines 101 and the pixel electrodes 118 and between the data lines 101 and the common electrode 120.

For melt connection using a laser, the first protective film 116 is preferably a thin film. Since a photosensitive organic film is a comparatively thick film, the first protective film 116 in the present embodiment preferably includes no organic insulating film (for example, photosensitive organic film). In the present embodiment, the upper layer data lines 1012 are separate from each other in the respective pixels P, the upper layer data lines 1012 may not be separate from each other in the pixels P and may be disposed linearly to vertically cross the array region.

Also in the present embodiment, the lower layer data lines 1011 are linearly formed to vertically cross the array region and the upper layer data lines 1012 are separate from each other in the pixels P. Yet, the lower layer data lines 1011 may be separate from each other in the pixels P and the upper layer data lines 1012 may be linearly disposed to vertically cross the array region.

Any of the modes in Embodiments 1 to 3 can appropriately be selected depending on the conditions such as the pixel size and the driving mode.

Embodiment 4

In the present embodiment, features unique to the present embodiment are mainly described, and the same features as those in the above embodiments are not described again. In Embodiments 1 to 3, liquid crystal display devices are described. In the present embodiment, an organic EL display device is described.

In the liquid crystal display devices of Embodiments 1 to 3, the insulating substrate in the array substrate functioning as the TFT substrate is a rigid substrate such as a glass substrate. The present embodiment relates to a top-emission organic EL display device whose backplane substrate corresponding to the array substrate is a flexible substrate containing a material such as a polyimide.

Figure 11:
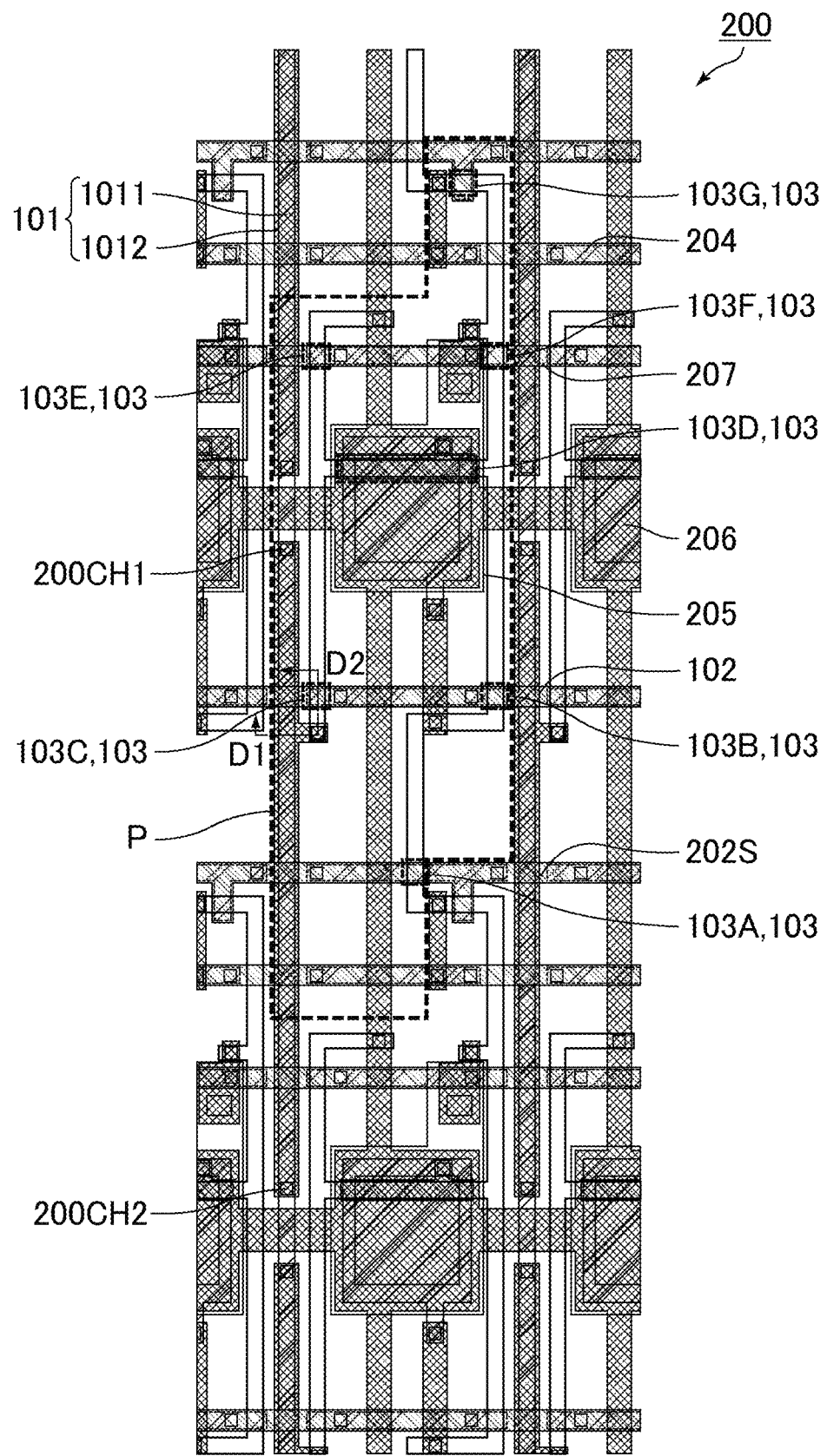
FIG. 11 is a schematic plan view of an organic electroluminescent display device of Embodiment 4.
Figure 12:
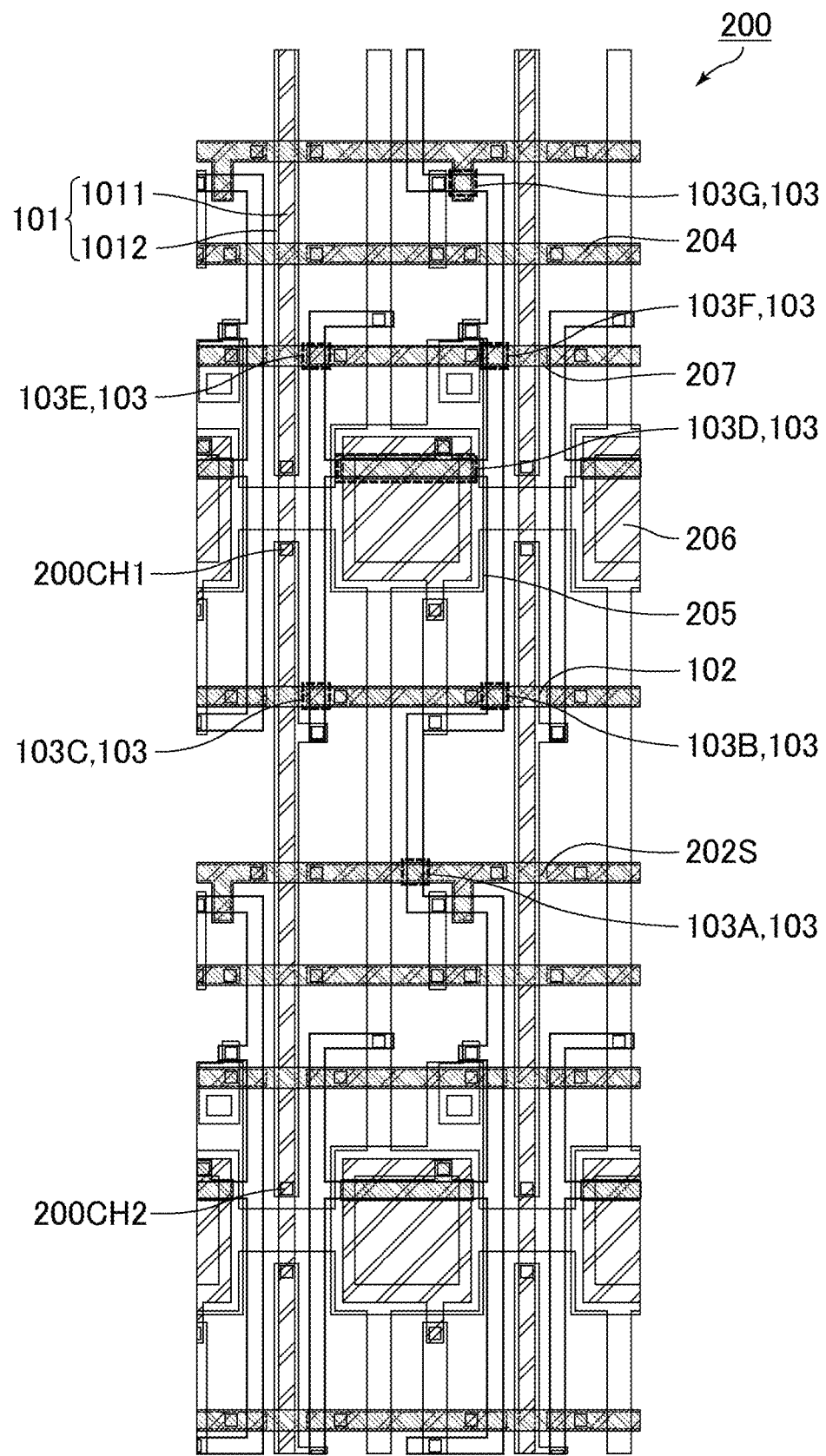
FIG. 12 is a schematic plan view of the organic electroluminescent display device of Embodiment 4, with a first line layer and a second line layer highlighted.
Figure 13:
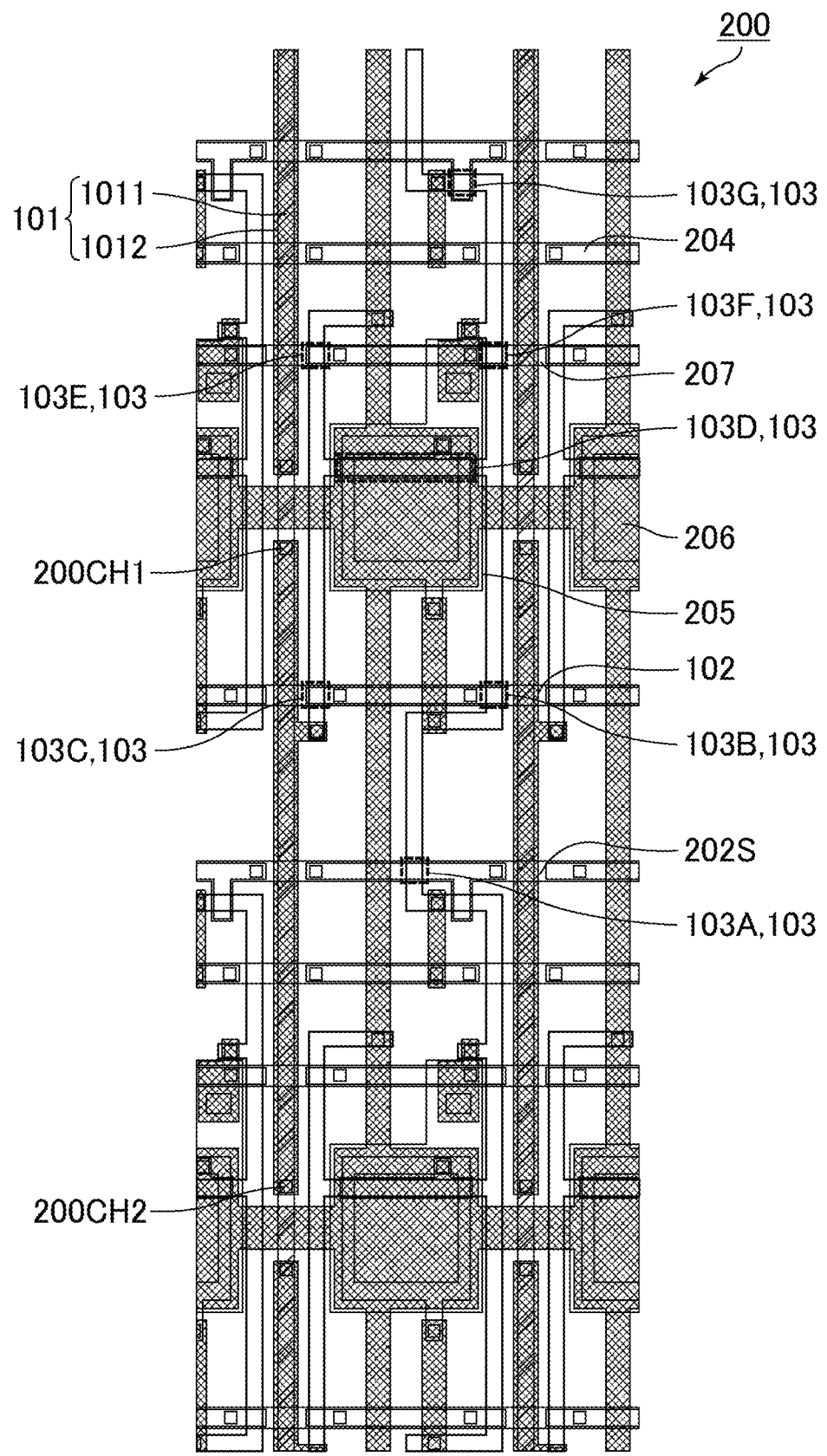
FIG. 13 is a schematic plan view of the organic electroluminescent display device of Embodiment 4, with a third line layer highlighted.
Figure 14:
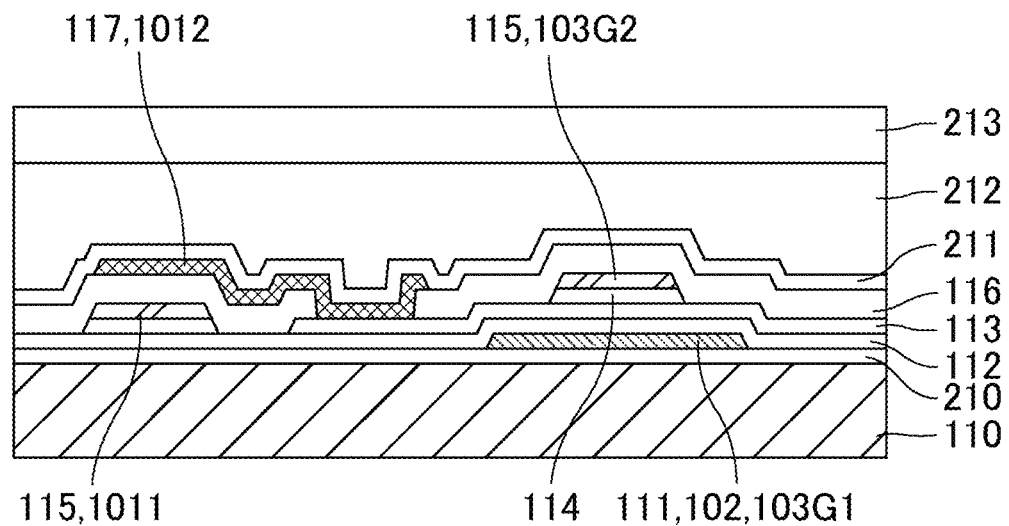
FIG. 14 is a schematic cross-sectional view of the organic electroluminescent display device of Embodiment 4.
Figure 15:
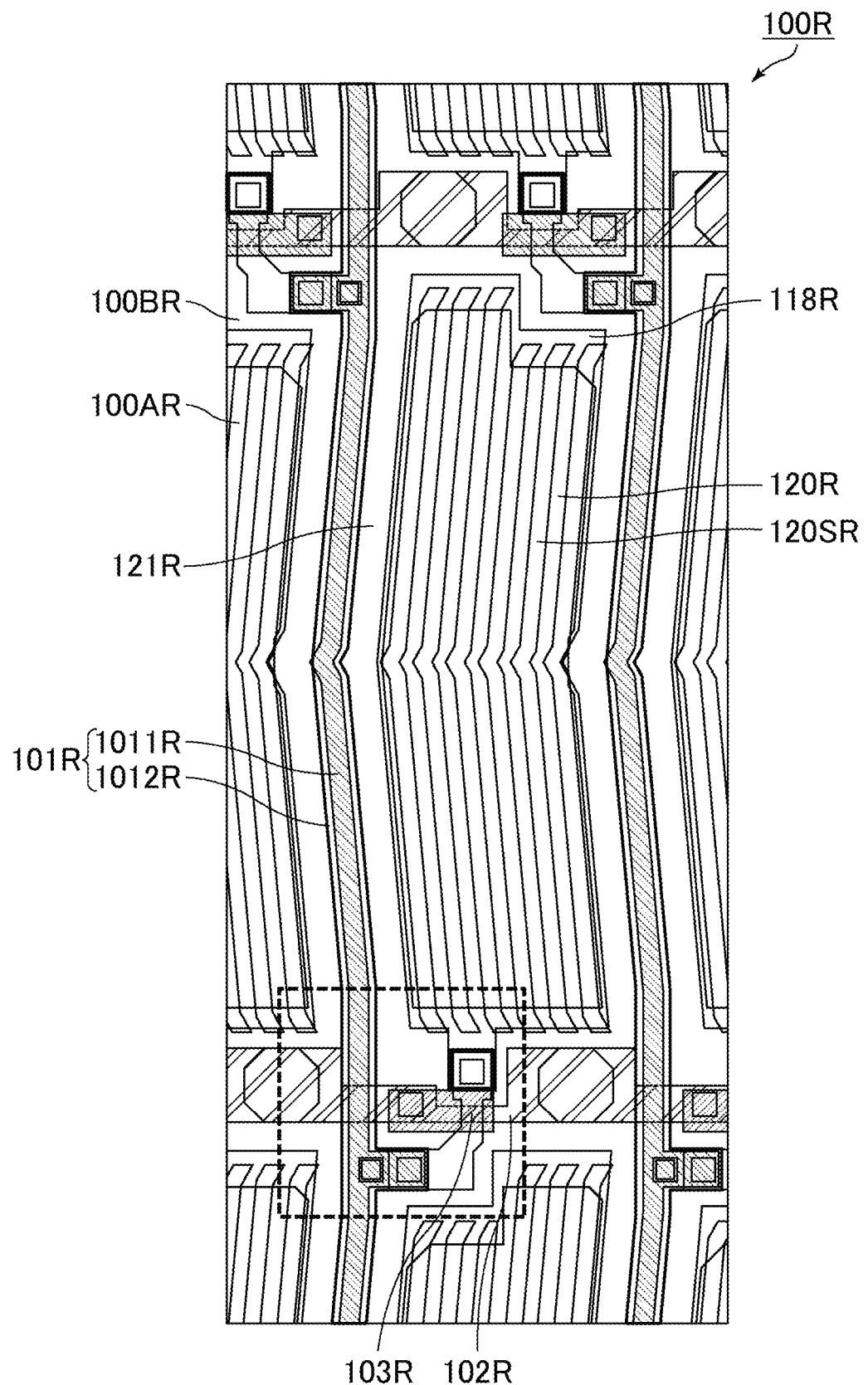
FIG. 15 is a schematic plan view of a liquid crystal display device of Comparative Embodiment 1.
Figure 16:
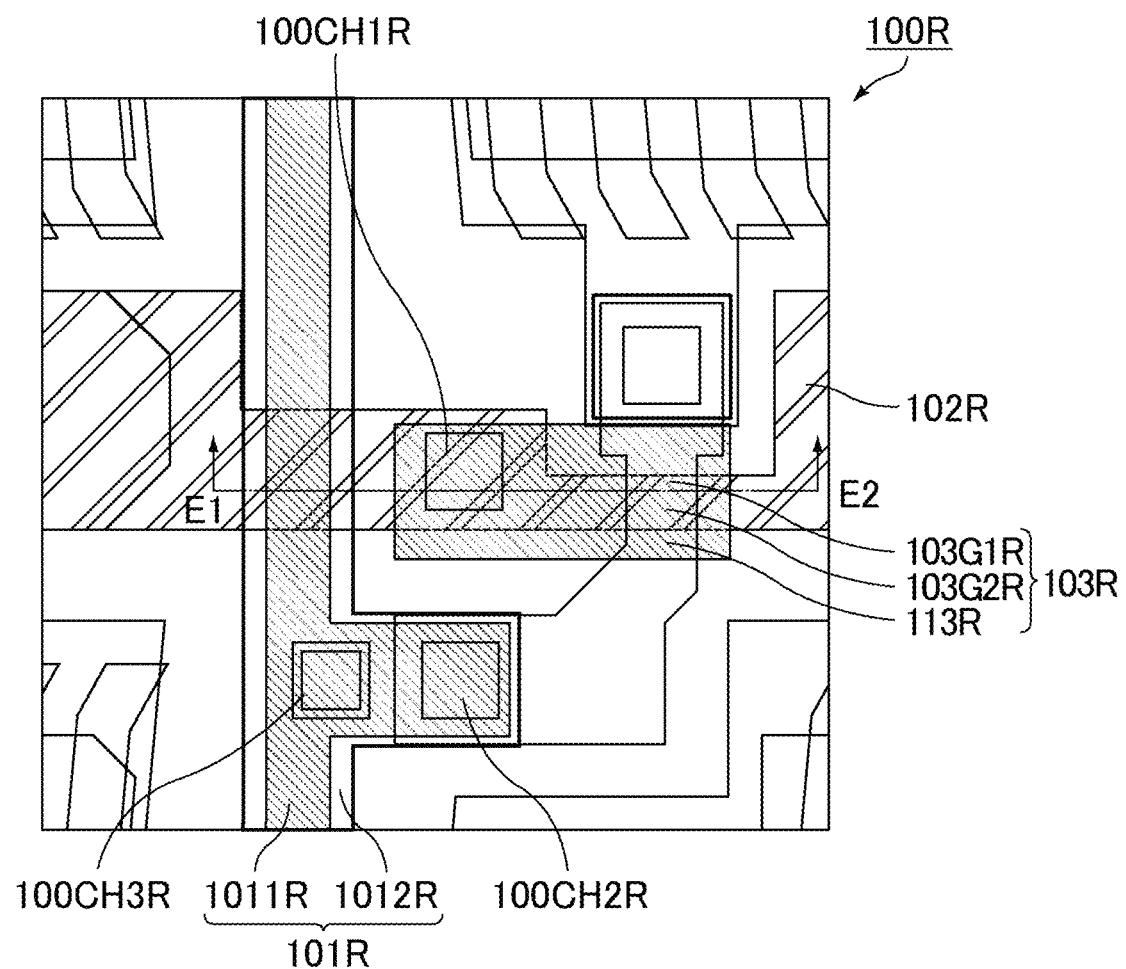
FIG. 16 is an enlarged schematic plan view of the region surrounded by the dashed line in FIG. 15.
Figure 17:
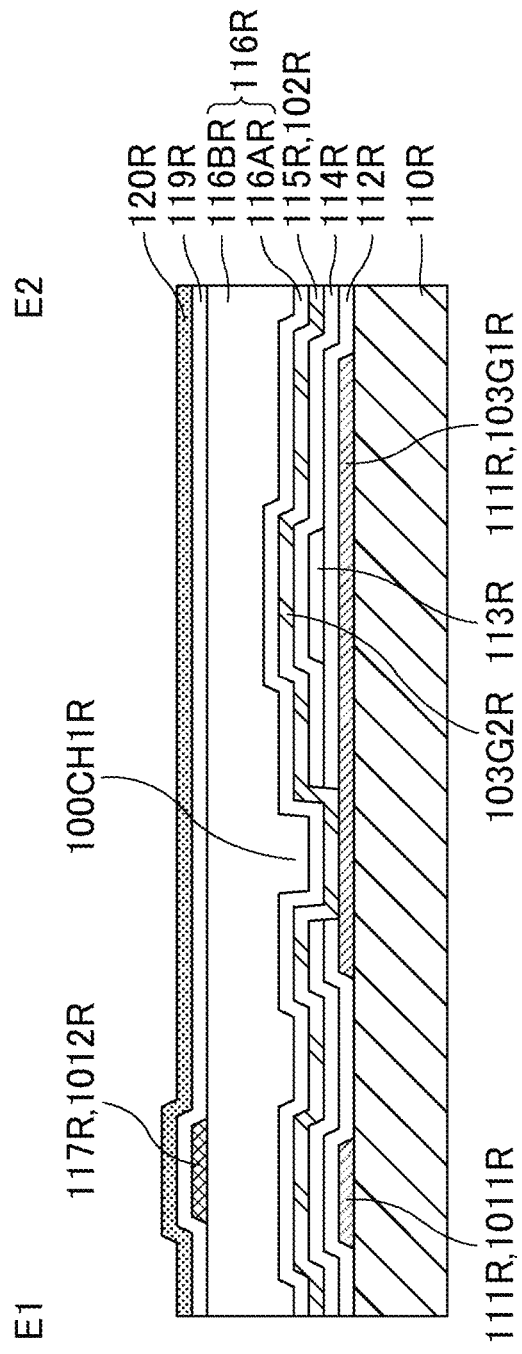
FIG. 17 is a schematic cross-sectional view of a TFT substrate in the liquid crystal display device of Comparative Embodiment 1.

FIG. 11 is a schematic plan view of the organic electroluminescent display device of Embodiment 4. FIG. 12 is a schematic plan view of the organic electroluminescent display device of Embodiment 4, with a first line layer and a second line layer highlighted. FIG. 13 is a schematic plan view of the organic electroluminescent display device of Embodiment 4, with a third line layer highlighted. FIG. 14 is a schematic cross-sectional view of the organic electroluminescent display device of Embodiment 4. FIGS. 11 and 13 show the third line layer 117 with grid-like hatching. FIG. 14 shows the cross section taken along the line D1-D2 in FIG. 11.

As shown in FIGS. 11 to 14, a TFT substrate in an organic EL display device (OLED display) 200 includes the gate lines 102 in the first line layer 111, the lower layer data lines 1011 in the second line layer 115 in an upper layer relative to the first line layer 111, and the upper layer data lines 1012 in the third line layer 117 in an upper layer relative to the first line layer 111. Thus, the data lines 101 can have a redundant structure in an upper layer relative to the gate lines 102 and the parasitic capacitance between the data lines 101 and the gate lines 102 can be reduced or eliminated without disposing the gate lines 102 between the lower layer data lines 1011 and the upper layer data lines 1012.

Each pixel P in the organic EL display device 200 is a region surrounded by the dashed line in FIG. 11 and includes switching elements (seven TFTs 103A to 103G in FIG. 11). Here, each of the TFTs 103A to 103G is also referred to as a TFT 103. As in Embodiments 1 to 3, each TFT 103 in the present embodiment includes a lower layer gate electrode 103G1 in the first line layer 111 and an upper layer gate electrode 103G2 in the second line layer 115. Also, as in Embodiment 2, the upper layer gate electrode 103G2 and the lower layer gate electrode 103G1 are directly connected to each other with no third line layer 117 in between.

Each pixel P may include, as well as the gate lines 102, a signal line (sub gate line 202S) to which the same signal as the signal input to a gate line 102 in another row.

For example, to the sub gate line 202S is supplied the same signal as the signal supplied to the gate line 102 in the previous pixel row. This sub gate line 202S is a signal line that controls the TFT 103A provided to initialize the gate electrode potential of the TFT 103D to a given potential (potential of an initialization power line 204). The TFT 103D is an element that controls the amount of current to be supplied to the OLED device layer, and one of its source electrode and drain electrode is connected, via the TFT 103F, to a reflective electrode (anode side electrode) 205. In an upper layer relative to the reflective electrode 205 is formed the OLED device layer by deposition. To the other electrode is connected the corresponding data line 101 via the TFT 103C and also connected, via the TFT 103E, a power line (anode side power line 206) that supplies power to the OLED device layer.

In the above embodiments, each lower layer data line 1011 in the present embodiment is linearly disposed to vertically cross the array region. In contrast, in the organic EL display device 200 of the present embodiment, anode side power lines 206 extending in a direction intersecting the data lines 101 are formed in the third line layer, and the upper layer data lines 1012 overlapping the lower layer data lines 1011 are separate from each other near the intersections with the anode side power lines 206. Each upper layer data line 1012 is connected to the corresponding lower layer data line 1011 in the two contact holes 200CH1 and 200CH2 at the anode side power line 206 side end of the upper layer data line 1012.

The gate lines 102 overlap the lower layer data lines 1011 and the upper layer data lines 1012.

In the present embodiment, a basecoat film 210 is formed in a further lower layer of the lower layer gate electrodes (between the lower layer gate electrodes and the insulating substrate), and the first protective film 116 may not include a photosensitive organic film. In the upper layer of the third line layer 117 are disposed pixel electrodes formed from a highly reflective metal material such as silver via an inorganic film 211 and a flattering film 212. In the upper layer of the pixel electrodes is formed a protective layer 213 except for the position on which the OLED device layer is to be formed by deposition.

The TFTs 103 in the present embodiment are applicable to the data lines 101 in OLED pixels including the TFTs 103A to 103G having various functions.

In the present embodiment, each TFT 103C is connected to the corresponding gate line 102 and the corresponding data line 101, the TFT 103C has a double gate structure including a lower layer gate electrode 103G1 and an upper layer gate electrode 103G2, and the gate line 102 is connected to the lower layer gate electrode 103G1. Yet, the TFT 103C may not have the double gate structure, and each TFT 103D may have a double gate structure including a lower layer gate electrode 103G1 and an upper layer gate electrode 103G2.

In the present embodiment, the third line layer 117 is usable as the anode side power line 206. The first line layer 111 constituting the gate lines 102 and the lower layer gate electrodes 103G1 also constitutes em lines 207 and the initialization power line 204 parallel to the gate lines 102. To the em lines 207 is supplied a signal for controlling the TFTs 103E and 103F that switch between the light emission period and the no light emission period of the OLED device layer (grayscale data writing period).

What is claimed is:

1. A thin-film transistor substrate comprising:
   a gate line;
   a data line;
   one or more thin-film transistors;
   an insulating substrate; and
   a stack disposed on the insulating substrate and sequentially including a first line layer, a first insulating film, a semiconductor layer, a second insulating film, a second line layer, a third insulating film, and a third line layer,
   at least one of the one or more thin-film transistors being connected to the gate line and the data line,
   the at least one of the one or more thin-film transistors including a lower layer gate electrode disposed in the first line layer, the semiconductor layer, and an upper layer gate electrode disposed in the second line layer,
   the gate line being disposed in the first line layer,
   the data line including a lower layer data line disposed in the second line layer and an upper layer data line disposed in the third line layer,
   the gate line intersecting at least one of the lower layer data line or the upper layer data line.

2. The thin-film transistor substrate according to claim 1, wherein the lower layer data line and the upper layer data line are connected to each other.

3. The thin-film transistor substrate according to claim 1, wherein the upper layer data line is not connected to the lower layer data line, and
   the upper layer data line overlaps the lower layer data line.

4. The thin-film transistor substrate according to claim 3, wherein the third insulating film includes no organic insulating film at least in part of the region where the lower layer data line and the upper layer data line overlap each other.

5. The thin-film transistor substrate according to claim 1, wherein the upper layer gate electrode is disposed on the semiconductor layer with the second insulating film in between, and
   the second insulating film is not disposed on the semiconductor layer except for the region in which the upper layer gate electrode is disposed.

6. A liquid crystal display device comprising the thin-film transistor substrate according to claim 1.

7. An organic electroluminescent display device comprising the thin-film transistor substrate according to claim 1.

* * * * *